United States Patent
Kakuno

(10) Patent No.: US 10,536,077 B2
(45) Date of Patent: Jan. 14, 2020

(54) CURRENT DETECTING CIRCUIT, CURRENT DETECTING DEVICE, AND SWITCHING DEVICE

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventor: Yutaka Kakuno, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 134 days.

(21) Appl. No.: 15/546,828

(22) PCT Filed: Jan. 29, 2016

(86) PCT No.: PCT/JP2016/052763
§ 371 (c)(1),
(2) Date: Jul. 27, 2017

(87) PCT Pub. No.: WO2016/125712
PCT Pub. Date: Aug. 11, 2016

(65) Prior Publication Data
US 2018/0013345 A1    Jan. 11, 2018

(30) Foreign Application Priority Data

Feb. 4, 2015    (JP) .................................. 2015-020402

(51) Int. Cl.
*G01R 27/08*    (2006.01)
*H02M 3/157*    (2006.01)
(Continued)

(52) U.S. Cl.
CPC ............ *H02M 3/157* (2013.01); *F02D 41/20* (2013.01); *H02M 7/48* (2013.01); *H03M 1/0609* (2013.01)

(58) Field of Classification Search
CPC ................ G01R 19/0092; G01R 19/08; G01R 19/0084; G01R 33/07; G01R 33/073;
(Continued)

(56) References Cited

U.S. PATENT DOCUMENTS 7,851,866 B2* 12/2010 Sakurai .............. H03K 17/0828
257/368
8,421,441 B2* 4/2013 Hirotsu .............. G01R 19/0092
324/123 R
(Continued)

FOREIGN PATENT DOCUMENTS

| JP | 2005-127832 A | 5/2005 |
| JP | 2012-029465 A | 2/2012 |
| JP | 2014-045503 A | 3/2014 |

OTHER PUBLICATIONS

Search Report for PCT/JP2016/052763, dated Apr. 19, 2016.

*Primary Examiner* — Thang X Le

(57) ABSTRACT

As paths for a current flowing through a conductor, a first current path through which a current flows from a first conductive portion to a second conductive portion, and a second current path through which a current flows from a third conductive portion to the second conductive portion are provided. Each of the first conductive portion, the second conductive portion, and the third conductive portion has a plate shape, a point P1 is located on a plate surface of the first conductive portion, and a point P2 is located on a plate surface of the second conductive portion. A current detecting circuit detects a value related to a potential difference between the points P1 and P2, and outputs a voltage value (Continued)

corresponding to a values of a current flowing through each of the first current path and the second current path.

12 Claims, 7 Drawing Sheets

(51) Int. Cl.
*F02D 41/20* (2006.01)
*H02M 7/48* (2007.01)
*H03M 1/06* (2006.01)

(58) Field of Classification Search
CPC ........ G01R 15/202; G01R 1/206; G01R 1/30; G01R 31/006; G01R 31/025; G01R 31/34; H02M 3/157; H02M 3/158; H02M 7/48; H03M 1/0609; F02D 41/20
See application file for complete search history.

(56) References Cited

U.S. PATENT DOCUMENTS

| | | | | |
|---|---|---|---|---|
| 2009/0295401 A1* | 12/2009 | Kamata | ................ | G01R 31/006 324/509 |
| 2014/0145696 A1* | 5/2014 | Hoshino | ............... | H02M 3/157 323/283 |
| 2015/0160268 A1* | 6/2015 | Juds | ................... | G01R 19/0084 324/251 |
| 2016/0077135 A1* | 3/2016 | Jockel | .................... | G01R 19/32 324/105 |
| 2016/0294379 A1* | 10/2016 | Hayashiguchi | ....... | H01L 25/072 |

* cited by examiner

| Temperature value | First voltage threshold | Second voltage threshold |
|---|---|---|
| T1~T2 | V11 | V21 |
| T2~T3 | V12 | V22 |
| T3~T4 | V13 | V23 |
| ⋮ | ⋮ | ⋮ |

CURRENT DETECTING CIRCUIT, CURRENT DETECTING DEVICE, AND SWITCHING DEVICE

CROSS-REFERENCE TO RELATED APPLICATIONS

This application is the U.S. national stage of PCT/JP2016/052763 filed Jan. 29, 2016, which claims priority of Japanese Patent Application No. JP 2015-020402 filed Feb. 4, 2015.

TECHNICAL FIELD

The present invention relates to a current detecting circuit that outputs a voltage value corresponding to the value of a current flowing through a current path, a current detecting device including the current detecting circuit, and a switching device that switches a current path through which a current flows, in accordance with a voltage value output by the current detecting circuit.

BACKGROUND

Today, as a power supply device installed in a vehicle, a power supply device that feeds power to a load via two current paths (e.g., see JP 2012-29465A) has been proposed.

In the power supply device described in JP 2012-29465A, one of the two current paths is provided with a DC/DC converter. The DC/DC converter transforms an applied voltage, and feeds the transformed voltage to a load. Consequently, the load is supplied with power. The other current path is not provided with a DC/DC converter, and power is directly fed to the load. In the power supply device of JP 2012-29465A, the current path used to feed power to the load is switched to one of the above-described two current paths.

FIG. 1 is a block diagram showing the configuration of a relevant portion of a conventional power supply device 8. In the conventional power supply device 8, one end of a generator 80 is connected to one end of each of a switch 81 and a DC/DC converter 82, and the other ends of the switch 81 and the DC/DC converter 82 are connected to one end of a resistor R8. The other end of the resistor R8 is connected to one end of a load 83. The other ends of the generator 80 and the load 83 are grounded. One end and the other end of the resistor R8 are connected to a positive terminal and a negative terminal, respectively, of a differential amplifier 84, and the output terminal of the differential amplifier 84 is connected to an A/D (Analog/Digital) converting portion 85. The A/D converting portion 85 is further connected to a control portion 86.

The control portion 86 turns the switch 81 on/off and activates/deactivates the DC/DC converter 82. When the control portion 86 turns the switch 81 off to activate the DC/DC converter 82, the DC/DC converter 82 lowers a DC output voltage output by the generator 80, and supplies the lowered voltage to the load 83 via the resistor R8. When the control portion 86 turns the switch 81 on to deactivate the DC/DC converter 82, the generator 80 supplies the output voltage to the load 83 via the switch 81 and the resistor R8.

The differential amplifier 84 amplifies the voltage value across the resistor R8, and outputs the amplified analog voltage value to the A/D converting portion 85. The output voltage value of the differential amplifier 84 increases with an increase in the value of the current flowing through the resistor R8. The A/D converting portion 85 converts the analog voltage value into a digital voltage value, and outputs the converted digital voltage value to the control portion 86. Since the voltage value across the resistor R8 is proportional to the value of the current flowing through the resistor R8, the resistor R8, the differential amplifier 84, and the A/D converting portion 85 function as a current detecting circuit.

Normally, the control portion 86 turns the switch 81 off to activate the DC/DC converter 82. The value of the current that can be passed via the DC/DC converter 82 is limited to a predetermined value. Therefore, a first current value less than the predetermined value and a second current value greater than or equal to the first current value are set. If the switch 81 is off and the DC/DC converter 82 is activated, the control portion 86 deactivates the DC/DC converter 82 to turn the switch 81 on when the value of the current flowing through the resistor R8 become greater than or equal to the first current value and the voltage value output by the A/D converting portion 85 becomes greater than or equal to the first voltage value. Consequently, the current path of the current flowing from the generator 80 to the load 83 is switched from a first path through which the current flows via the DC/DC converter 82 to a second path through which the current flows via the switch 81. In this manner, the control portion 86 switches the current path, thus making it possible to continuously supply a current to the load 83 even if the load 83 needs the supply of a current having a value greater than or equal to the predetermined value.

If the switch 81 is on and the DC/DC converter 82 is deactivated, the control portion 86 turns the switch 81 off to activate the DC/DC converter 82 when the value of the current flowing through the second path becomes less than the second current value and the voltage output by the A/D converting portion 85 becomes less than second voltage value. Consequently, the current path of the current flowing from the generator 80 to the load 83 is switched from the second path to the first path. The voltage lowered by the DC/DC converter 82 is supplied to the load 83 again. The current detecting circuit and the control portion 86 described above function as a switching device that switches the current path through which a current flows, to the first path or the second path.

The A/D converting portion 85 performs processing such as rounding or truncation to quantize the voltage value output by the differential amplifier 84 to a voltage value that is closest or second closest to the voltage value output by the differential amplifier 84, from among the voltage values obtained by equally dividing a reference voltage value by a predetermined number. In the conventional power supply device 8 in which the current path is switched in the above-described manner, a current having a value less than the first current value flows through the first path, and a current having a value greater than or equal to the second current value flows through the second path. Since the second path is provided to pass a current having a value greater than or equal to the first current value, a current having a value greater than or equal to the first current value flows through the second path.

For example, when a current of zero to 100 A flows through the first path and a current of 90 to 200 A flows through the second path in the conventional power supply device 8, a current of zero to 200 A flows through the resistor R8. When the voltage value output by the differential amplifier 84 if a current of 200 A flows through the resistor R8 is 10 V, the voltage value output by the differential amplifier 84 varies in the range of zero to 10 V. Accordingly, the reference voltage value of the A/D converting portion 85 is set to be greater than or equal to 10 V. If the reference voltage value is 10 V and the A/D converting portion 85 converts the voltage value into a 10-bit digital value, the A/D converting portion 85 quantizes the voltage value output by the differential amplifier 84 to a voltage value that is closest or second closest to the voltage value output by the differential amplifier 84, from among voltage values obtained by equally dividing 10 V (the reference voltage value) by 1023 (the predetermined number). At this time, the interval between markings is about 9.78 mV.

The value of the current flowing through the first path varies in the range of zero to 100 A. Let us now consider a configuration in which only the value of the current flowing through the first path is detected. When the voltage value output by the differential amplifier 84 if a current of 100 A flows through the resistor R8 is 5 V, the reference voltage value of the A/D converting portion 85 can be set to 5 V. At this time, the A/D converting portion 85 quantizes the voltage value output by the differential amplifier 84 to a voltage value that is closest or second closest to the voltage value by the differential amplifier 84, from along voltage values obtained by equally dividing 5 V (the reference voltage value) by 1023 (the predetermined number). At this time, the interval between markings is about 4.89 mV. When the reference voltage value is 5 V, the interval between markings is small. Accordingly, the current detecting circuit composed of the resistor R8, the differential amplifier 84, and the A/D converting portion 85 can highly accurately detect the value of the current flowing through the first path.

However, in the current detecting circuit installed in the conventional power supply device 8, the reference voltage value of the A/D converting portion 85 is set in accordance with the maximum value of the current flowing through the second path, thus resulting in the problem that the value of the current flowing through the first path cannot be detected highly accurately. In this case, the current path may not be switched appropriately.

To solve this problem, it is conceivable to adopt a configuration in which the number of each of the resistor, the differential amplifier, and the A/D converting portion is increased to two, and the values of the currents flowing through the first path and the second path are separately detected. However, this configuration requires a large number of components, and therefore has the problem of an increased manufacturing cost.

The present invention has been made in view of such circumstances, and it is an object of the invention to provide an inexpensive current detecting circuit capable of outputting a voltage value accurately indicating the value of a current flowing through each of the two current paths, as well as a current detecting device and a switching device each including the current detecting circuit.

SUMMARY

A current detecting circuit according to an aspect of the present invention is configured to output a voltage value corresponding to a value of a current flowing through a first current path extending from a first conductive plate to a second conductive plate, and a value of a second current path extending from a third conductive plate to the second conductive plate, the current detecting circuit including a potential difference detecting portion that detects a value related to a potential difference between two points located on plate surfaces of the first conductive plate and the second conductive plate.

According to this aspect of the present invention, a current flows through the first current path extending from the first conductive plate to the second conductive plate, or the second current path extending from the third conductive plate to the second conductive plate. A value related to the potential difference between the point located on the plate surface of the first conductive plate and the point located on the plate surface of the third conductive plate is detected.

The value related to the potential difference between the two points varies in accordance with the value of the current flowing through the first current path and the value of the current flowing through the second current path. Then, the value related to the potential difference between the two points that is detected when a current having a given value flows through the second current path is different from the value related to the potential difference between the two points that is detected when a current having the same value flows through the first current path.

The value related to the potential difference between the two points is, for example, a voltage value between the two points, or a value of the current flowing between the two points. The voltage value output from the circuit is a voltage value between the two points, or a voltage value based on a value of a current flowing between the two points. According to this aspect of the present invention, for example, the value related to the potential difference between the two points when a current of 100 A flows through the first current path can be matched with the value related to a potential difference between the two points when a current of 200 A flows through the second current path. In this case, the voltage value accurately indicating the value of a current flowing through each of the first current path and the second current path is output. Further, the manufacturing cost is low since only one component is needed to detect the value related to the potential difference between the two points.

The current detecting circuit according to this aspect of the present invention includes a conductive wire connected between the two points, wherein the potential difference detecting portion detects a value of a current flowing through the conductive wire.

According to this aspect of the present invention, the value of the current flowing through the conductive wire connected between the point located on the plate surface of the first conductive plate and the point located on the plate surface of the second conductive plate is detected.

In the current detecting circuit according to this aspect of the present invention, the potential difference detecting portion detects a voltage value between the two points.

According to this aspect of the present invention, the voltage value between the point located on the plate surface of the first conductive plate and the point located on the plate surface of the second conductive plate is detected.

In the current detecting circuit according to this aspect of the present invention, each of the first conductive plate and the third conductive plate is connected to the second conductive plate via a resistive portion having a lower conductivity than the first conductive plate, the second conductive plate, and the third conductive plate.

According to this aspect of the present invention, each of the first conductive plate and the third conductive plate is connected to the second conductive plate via a resistive portion having a lower conductivity than the first conductive plate, the second conductive plate, and the third conductive plate. Accordingly, the voltage value between the point located on the plate surface of the first conductive plate and the point located on the surface of the second conductive plate is large.

A current detecting device according to an aspect of the present invention includes: the above-described current detecting circuit; a temperature detecting portion that detects a temperature value of a conductor formed by connecting the first conductive plate and the third conductive plate with the second conductive plate; and a calculating portion that calculates a value of a current flowing through the first current path or the second current path, based on the temperature value detected by the temperature detecting portion and the voltage value output by the current detecting circuit.

According to this aspect of the present invention, the first conductive plate and the third conductive plate are connected to the second conductive plate, and the temperature value of the conductor formed by the first conductive plate, the second conductive plate, and the third conductive plate is detected. The value of a current flowing through the first current path or the second current path is calculated based on the detected temperature value and the voltage value output by the current detecting circuit.

A current detecting device according to an aspect of the present invention includes: the above-described current detecting circuit; a temperature detecting portion that detects a temperature value of the resistive portion; and a calculating portion that calculates a value of a current flowing through the first current path or the second current path, based on the temperature value detected by the temperature detecting portion and the voltage value output by the current detecting circuit.

According to this aspect of the present invention, the temperature value of the resistive portion is detected, and the value of the current flowing through the first current path or the second current path is calculated based on the detected temperature value and the voltage value output by the current detecting circuit.

A switching device according to an aspect of the present invention includes: the above-described current detecting circuit; and a switching portion that switches a current path through which a current flows, to the first current path or the second current path, wherein the switching portion performs the switching based on which of the first current path and the second current path a current is flowing through, and the voltage value output by the current detecting circuit.

According to this aspect of the present invention, for example, whether the current path through which a current flow should be switched to the second current path is determined based on the voltage value output by the current detecting circuit in a state where a current is flowing through the first current path, and whether the current path through which a current flows should be switched to the first current path is determined based on the voltage value output by the current detecting circuit in a state where a current flows through the second current path. The current path through which a current flows can be appropriately switched in the current detecting circuit by adjusting the positions of the two points so as to output a voltage value accurately indicating the value of a current flowing through each of the first current path and the second current path.

A switching device according to an aspect of the present invention includes: the above-described current detecting circuit; a switching portion that switches a current path through which a current flows, to the first current path or the second current path; and a temperature detecting portion that detects a temperature value of a conductor formed by connecting the first conductive plate and the third conductive plate with the second conductive plate, wherein the switching portion performs the switching based on which of the first current path and the second current path a current is flowing through, the voltage value output by the current detecting circuit, and the temperature value detected by the temperature detecting portion.

According to this aspect of the present invention, the first conductive plate and the third conductive plate are connected to the second conductive plate, and the temperature value of the conductor formed by the first conductive plate, the second conductive plate, and the third conductive plate is detected. Whether the current path through which a current flows should be switched is determined based on not only a determination as to which of the first current path and the second current path a current flows through, and the voltage value output by the current detecting circuit, but also the detected temperature value. Accordingly, the current path through which a current flows can be switched more appropriately.

A switching device according to an aspect of the present invention includes: the above-described current detecting circuit; a switching portion that switches a current path through which a current flows, to the first current path or the second current path; and a temperature detecting portion that detects a temperature value of the resistive portion, wherein the switching portion performs the switching based on which of the first current path and the second current path a current is flowing through, the voltage value output by the current detecting circuit, and the temperature value detected by the temperature detecting portion.

According to this aspect of the present invention, the temperature value of the resistive portion is detected. Whether the current path through which a current flows should be switched is determined based on the detected temperature value, a determination as to which of the first current path and the second current path a current flows through, and the voltage value output by the current detecting circuit. The current path through which a current flows can be switched appropriately in the current detecting circuit by adjusting the positions of the two points so as to output a voltage value accurately indicating the value of a current flowing through each of the first current path and the second current path. Further, the determination as to whether the current path should be switched is based on the detected temperature value as well, so that the current path can be switched more appropriately.

In the switching device according to this aspect of the present invention, the switching device performs the switching by controlling activation/deactivation of a transforming portion that transforms an applied voltage and outputs the transformed voltage to the first conductive plate, and turns a switch on/off whose one end is connected to the third conductive plate.

According to this aspect of the present invention, the transforming portion transforms an applied voltage, and outputs the transformed voltage to the first conductive plate. While the transforming portion is activated, a current flows through the first current path. Since one end of the switch is connected to the third conductive plate, a current flows through the second current path while the switch is on. The current path through which a current flows can be switched to the first current path by activating the transforming portion to turn the switch off, and the current path through which a current flows can be switched to the second current path by deactivating the transforming portion to turn the switch on.

Advantageous Effects

According to the present invention, it is possible to output a voltage value accurately indicating the value of a current flowing through each of the two current paths, and the manufacturing cost is low.

DETAILED DESCRIPTION OF PREFERRED EMBODIMENTS

Hereinafter, the present invention will be described on the basis of drawings showing embodiments thereof.

Embodiment 1

Figure 2:
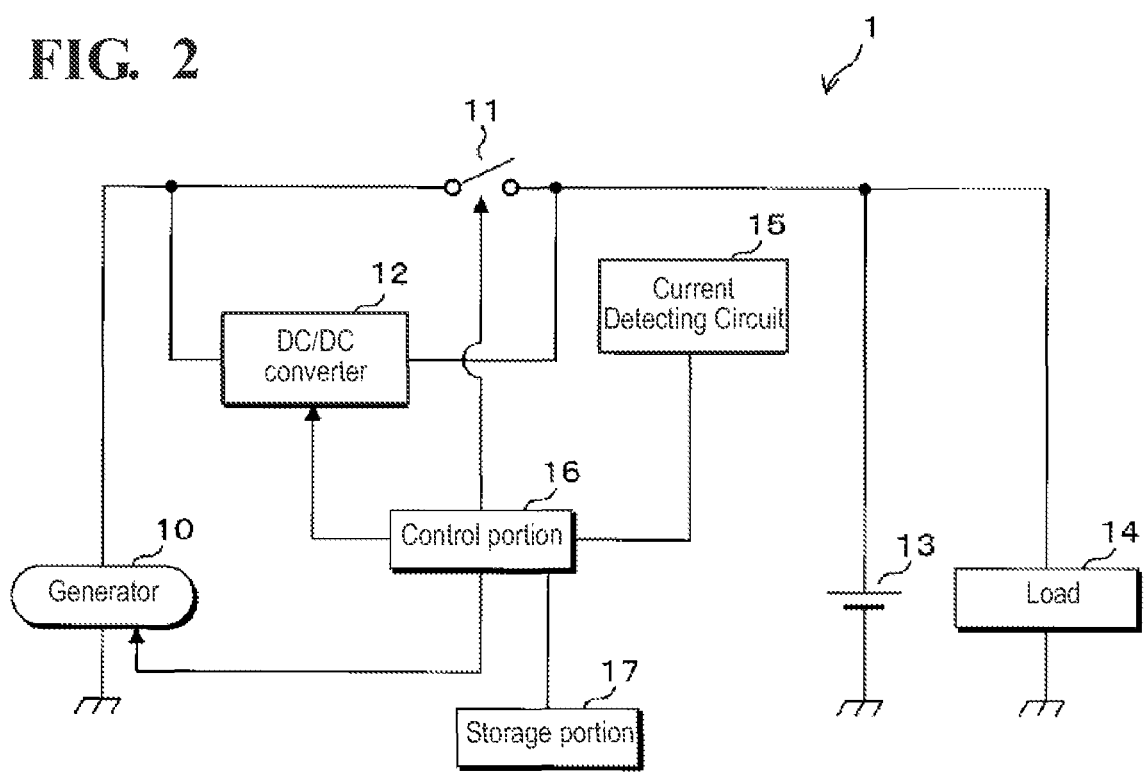
FIG. 2 is a block diagram showing the configuration of a relevant portion of a power supply device according to Embodiment 1.

FIG. 2 is a block diagram showing the configuration of a relevant portion of a power supply device 1 according to Embodiment 1. The power supply device 1 is suitably installed in a vehicle, and includes a generator 10, a switch 11, a DC/DC converter 12, a battery 13, a load 14, a current detecting circuit 15, a control portion 16, and a storage portion 17.

One end of the generator 10 is connected to one end of each of the switch 11 and the DC/DC converter 12. The other ends of the switch 11 and the DC/DC converter 12 are connected to a positive electrode of the battery 13 and one end of the load 14. The other ends of the generator 10 and the load 14, and a negative electrode of the battery 13 are grounded. The current detecting circuit 15 and the storage portion 17 are separately connected to the control portion 16.

The generator 10 generates AC power in cooperation with an engine (not shown), rectifies the generated AC power to DC power, and smoothes the rectified power. The generator 10 supplies, as an output voltage, a DC voltage related to the smoothed DC power to the battery 13 and the load 14 via the switch 11. The generator 10 further applies the output voltage to one end of the DC/DC converter 12.

To the generator 10, a lowering instruction instructing the generator 10 to lower the output voltage value to a predetermined first output voltage value, for example, 12 V, and a raising instruction instructing the generator 10 to raise the output voltage value to a second output voltage value that is higher than the first output voltage value are input from the control portion 16. The generator 10 lowers the output voltage value to the first output voltage value when the lowering instruction is input from the control portion 16, and raises the output voltage value to the second output voltage value when the raising instruction is input from the control portion 16.

The switch 11 is turned on/off by the control portion 16. When the switch 11 is on, the output voltage of the generator 10 is supplied to the battery 13 and the load 14 via the switch 11.

The DC/DC converter 12 transforms the output voltage of the generator 10 that is applied to its one end into a predetermined voltage, and supplies the transformed voltage to the battery 13 and the load 14 from its other end. The value of the voltage transformed by the DC/DC converter 12 is 12 V, for example.

To the DC/DC converter 12, an activation instruction instructing activation and a deactivation instruction instructing deactivation are input from the control portion 16. The DC/DC converter 12 is activated when the activation instruction is input from the control portion 16, and is deactivated when the deactivation instruction is input from the control portion 16.

As described previously, the output voltage is supplied to the battery 13 from the generator 10 via the switch 11, or the transformed voltage is supplied from the DC/DC converter 12. Consequently, the battery 13 stores power.

The load 14 is an electric device installed in the vehicle.

When the DC/DC converter 12 is activated if the generator 10 is generating power, the output voltage value of the generator 10 is the second output voltage value, and the switch 11 is off. At this time, the voltage transformed by the DC/DC converter 12 is supplied to the battery 13 and the load 14, and the battery 13 and the load 14 are powered.

When the DC/DC converter 12 is being deactivated in the same case, the output voltage value of the generator 10 is the first output voltage value, and the switch 11 is on. At this time, the output voltage of the generator 10 is supplied to the battery 13 and the load 14, and the battery 13 and the load 14 are powered.

If the generator 10 stops power generation, the output voltage of the battery 13 is supplied to the load 14, and the load 14 is powered.

The current detecting circuit 15 converts an analog value related to the current flowing to the battery 13 and the load 14 into a digital value, and outputs the converted digital value to the control portion 16.

The control portion 16 includes a CPU (Central Processing Unit), and executes processing by executing control programs stored in a ROM (Read Only Memory), which is not shown. On the basis of the digital value input from the current detecting circuit 15, the control portion 16 performs output of the lowering instruction/raising instruction to the generator 10, turning on/off of the switch 11, output of the activation instruction/deactivation instruction to the DC/DC converter 12, and the like.

The storage portion 17 is a nonvolatile memory, and data necessary for the control portion 16 to execute processing is stored in the storage portion 17. Reading and writing of the content stored in the storage portion 17 are performed by the control portion 16.

Figure 3:
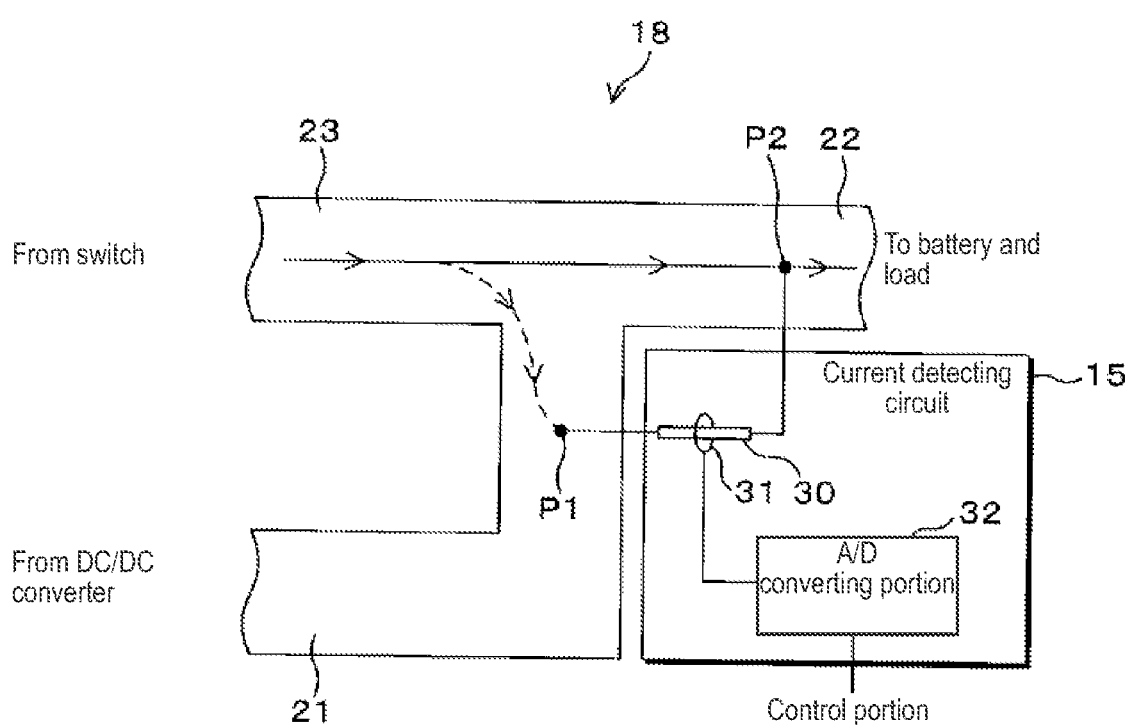
FIG. 3 is a diagram illustrating current detection.

FIG. 3 is a diagram illustrating current detection. The power supply device 1 further includes a plate-shaped conductor 18 that connects the other ends of the switch 11 and the DC/DC converter 12 to the positive electrode of the battery 13 and one end of the load 14. The conductor 18 is composed of a first conductive portion 21, a second conductive portion 22, and a third conductive portion 23. Each of the first conductive portion 21, the second conductive portion 22, and the third conductive portion 23 is a so-called bus bar, and has a plate shape. FIG. 3 shows a plate surface of each of the first conductive portion 21, the second conductive portion 22, and the third conductive portion 23.

Each of the first conductive portion 21 and the third conductive portion 23 is connected to the second conductive portion 22. The other end of the switch 11 is connected to the third conductive portion 23. The other end of the DC/DC converter 12 is connected to the first conductive portion 21. The positive electrode of the battery 13 and one end of the load 14 are connected to the second conductive portion 22. The DC/DC converter 12 outputs the transformed voltage to the first conductive portion 21. The DC/DC converter 12 functions as a transforming portion.

The conductor 18 has a first current path through which a current flows from the first conductive portion 21 to the second conductive portion 22, and a second current path through which a current flows from the third conductive portion 23 to the second conductive portion 22. When the switch 11 is off and the DC/DC converter 12 is activated if the generator 10 is generating power, a current flows through the first current path. When the switch 11 is on and the DC/DC converter 12 is being deactivated in the same case, a current flows through the second current path.

The current supplied from the DC/DC converter 12 to the load 14 is limited. The control portion 16 performs a switching process for switching the current path through which a current flows in the conductor 18, to the first current path or the second current path. In the switching process, the control portion 16 switches the current path through which a current flows in the conductor 18, from the first current path to the second current path if the value of the current flowing through the first current path is greater than or equal to a first current threshold, for example, 100 A. In addition, in the switching process, the control portion 16 switches the current path through which a current flowing in the conductor 18, from the second current path to the first current path if the value of the current flowing through the second current path is lower than a second current threshold, for example, 90 A. The second current threshold is lower than or equal to the first current threshold.

The current detecting circuit 15 includes a conductive wire 30, a current sensor 31, and an A/D converting portion 32. The conductive wire 30 is connected between a point P1 located on the surface of the first conductive portion 21 and a point P2 located on the surface of the second conductive portion 22. The current sensor 31 has a ring shape, and surrounds the conductive wire 30. The A/D converting portion 32 is connected separately to the control portion 16 and the current sensor 31. The points P1 and P2 correspond to the two points recited in the claims.

In the conductor 18, when a current flows through the first current path, or in other words, when a current flows from the first conductive portion 21 to the second conductive portion 22, a part of the current flows from the point P1 to the point P2 via the conductive wire 30. In FIG. 3, when a current flows to the second current path as indicated by the solid arrows, a part of the current flows from the point P1 to the point P2 via the conductive wire 30 as indicated by the dashed arrows.

When a current flows through the first current path, a current having a value that is smaller by an inverse of a first constant, for example, a value that is $1/1000$ of the value of the current flowing through the first current path flows through the conductive wire 30. When a current flows through the second current path, a current having a value that is smaller by an inverse of a second constant, for example, a value that is $1/2000$ of the value of the current flowing through through the second current path flows through the conductive wire 30. Here, the second constant is larger than the first constant.

Each of the first constant and the second constant is dependent on the ratio between the resistance value between the points P1 and P2 in the conductor 18 and the resistance value of the conductive wire 30. The second constant is further dependent on the position of the point P1. The second constant increases with an increase in the distance of the point P1 from the third conductive portion 23.

The electrical resistivity of the conductor 18 is dependent on the temperature value of the conductor 18. Likewise, the electrical resistivity of the conductive wire 30 is dependent on the temperature value of the conductive wire 30. The temperature values of the conductor 18 and the conductive wire 30 are substantially the same. The respective electrical resistivities of the conductor 18 and the conductive wire 30 vary in the same manner in accordance with the variations of the temperature values of the conductor 18 and the conductive wire 30. When the electrical resistivity of the conductor 18 is increased 1.1 times by a change in the temperature values of the conductor 18 and the conductive wire 30, the electrical resistivity of the conductive wire 30 is also increased 1.1 times. Accordingly, the ratio of the electrical resistivity of each of the conductor 18 and the conductive wire 30 is constant regardless of the temperature values of the conductor 18 and the conductive wire 30.

Therefore, when a current flows through the first current path, a current having a value that is smaller by an inverse of the first constant than the value of the current flowing through the first current path flows through the conductive wire 30, regardless of the temperature values of the conductor 18 and the conductive wire 30. Likewise, when a current flows through the second current path, a current having a value that is smaller by an inverse of the second constant than the current flowing through the second current path flows through the conductive wire 30, regardless of the temperature values of the conductor 18 and the conductive wire 30.

The current sensor 31 outputs, to the A/D converting portion 32, a voltage value corresponding to the value of the current flowing though the conductive wire 30. The voltage value output by the current sensor 31 is an analog value, and increases/decreases with an increase/decrease in the current flowing through the conductive wire 30. The voltage value output by the current sensor 31 is dependent on the respective potentials of the points P1 and P2.

The A/D converting portion 32 converts the analog voltage value input from the current sensor 31 into a digital voltage value, and outputs the converted digital voltage value to the control portion 16. When converting the analog voltage value into the digital voltage value, the A/D converting portion 32 performs processing such as rounding or truncation to quantize the voltage value input from the current sensor 31 to a voltage value that is closest or second closest to the voltage value input to the current sensor 31, from among the voltage values that are obtained by equally dividing a preset reference voltage value by a predetermined number. The A/D converting portion 32 outputs the converted digital voltage value to the control portion 16.

The digital voltage value output by the A/D converting portion 32 to the control portion 16 corresponds to a value related to the potentials of the points P1 and P2. The current sensor 31 outputting, to the A/D converting portion 32, an analog voltage value corresponding to the value of the current flowing through the conductive wire 30, and the A/D converting portion 32 converting the analog voltage value input from the current sensor 31 into a digital voltage value, and outputting the converted voltage value correspond to "detecting the value of the current flowing through the conductive wire 30".

The storage portion 17 stores a first conversion formula for converting the voltage value output by the A/D converting portion 32 into a value of the current flowing through the first current path and a second conversion formula for converting the voltage value output by the A/D converting portion 32 into a value of the current flowing through the second current path. The control portion 16 converts the voltage value output by the A/D converting portion 32 into a value of the current flowing through the first current path or the second current path by using the first conversion formula or the second conversion formula.

Figure 4:
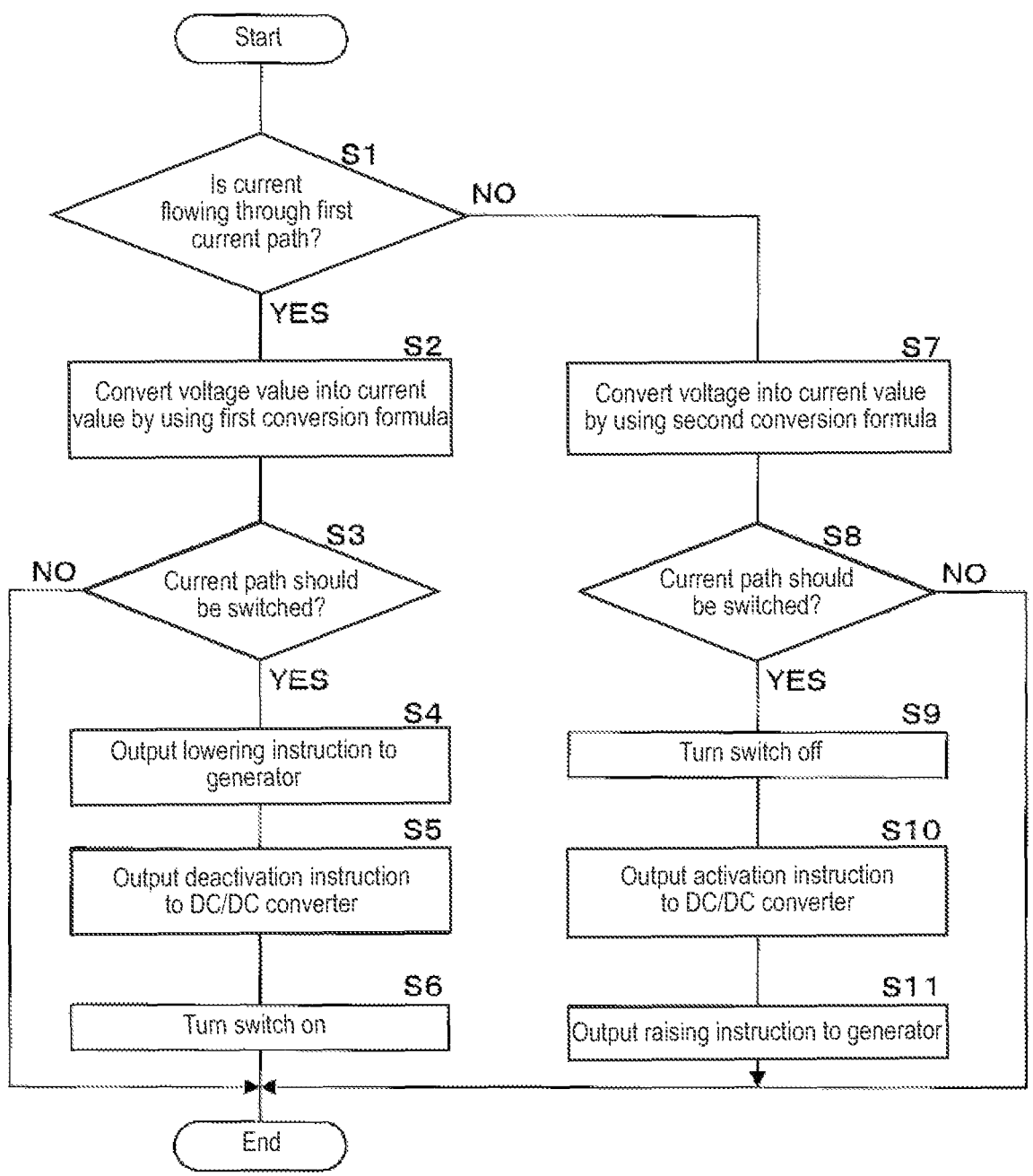
FIG. 4 is a flowchart illustrating a switching process executed by a control portion.

FIG. 4 is a flowchart illustrating a switching process executed by the control portion 16. When the generator 10 is generating power, the control portion 16 periodically executes the switching process.

First, the control portion 16 determines whether a current is flowing through the first current path (step S1). The control portion 16 activates the DC/DC converter 12 by outputting the activation instruction, and deactivates the DC/DC converter 12 by outputting the deactivation instruction. If the switch 11 is turned off to activate the DC/DC converter 12, the control portion 16 determines that a current is flowing through the first current path. If the switch 11 is turned on to deactivate the DC/DC converter 12, the control portion 16 determines that no current is flowing through the first current path.

If it is determined that a current is flowing through the first current path (S1: YES), the control portion 16 converts the voltage value output by the A/D converting portion 32 into a current value by using the first conversion formula (step S2). Here, the current value is a value of the current flowing through the first current path.

Next, the control portion 16 determines whether the current path through which a current flows in the conductor 18 should be switched to the second current path (step S3). If the current value converted at step S2 is greater than or equal to the first current threshold, for example, 100 A, the control portion 16 determines that the current path should be switched to the second current path. If the current value converted at step S2 is lower than the first current threshold, the control portion 16 determines that the current path should not be switched to the second current path. The first current threshold is stored in advance in the storage portion 17.

If it is determined that the current path should be switched to the second current path (S3: YES), the control portion 16 outputs the lowering instruction to the generator 10 (step S4). Consequently, the output voltage value of the generator 10 is lowered to the first output voltage value, for example, 12 V.

Next, the control portion 16 outputs the deactivation instruction to the DC/DC converter 12 (step S5), to turn the switch 11 on (step S6). Consequently, the current flows from one end of the generator 10 to the third conductive portion 23 and the second conductive portion 22 via the switch 11. In other words, the current path through which a current flows in the conductor 18 is switched to the second current path.

As described thus far, the control portion 16 deactivates the DC/DC converter 12 to turn the switch 11 on, thereby switching the current path through which a current flows, from the first current path to the second current path.

If it is determined that the current path should not be switched to the second current path (S3: NO), or after execution of step S6, the control portion 16 ends the process.

If it is determined that no current is flowing through the first current path, or in other words, if a current is flowing through the second current path (S1: NO), the control portion 16 converts the voltage value output by the A/D converting portion 32 into a current value by using the second conversion formula (step S7). Here, the current value is a value of the current flowing through the second current path.

Next, the control portion 16 determines whether the current path through which a current flows in the conductor 18 should be switched to the first current path (step S8). If the current value converted at step S7 is lower than the second current threshold, for example, 90 A, the control portion 16 determines that the current path should be switched to the first current path. If the current value converted at step S7 is greater than or equal to the second current threshold, the control portion 16 determines that the current path should not be switched to the first current path. The second current threshold is stored in advance in the storage portion 17.

If it is determined that the current path should be switched to the first current path (S8: YES), the control portion 16 turns the switch 11 off (step S9), and outputs the activation instruction to the DC/DC converter 12 (step S10). Consequently, a current flows from one end of the generator 10 to the first conductive portion 21 and the second conductive portion 22 via the DC/DC converter 12. In other words, the current path through which a current flows in the conductor 18 is switched to the first current path.

As described thus far, the control portion 16 turns the switch 11 off to activate the DC/DC converter 12, thereby switching the current path through which a current flows, from the second current path to the first current path.

Next, the control portion 16 outputs the raising instruction to the generator 10 (step S11). Consequently, the output voltage value of the generator 10 is raised from the first output voltage value to the second output voltage value.

If it is determined that the current path should not be switched to the first current path (S8: NO), or after execution of step S11, the control portion 16 ends the process.

In the switching process, the control portion 16 determines whether the current path through which a current flows should be switched, based on the current path through which a current is now flowing in the conductor 18 and the voltage value output by the A/D converting portion 32 of the current detecting circuit 15. The voltage value output by the A/D converting portion 32 is a value related to the potentials of the points P1 and P2, and corresponds to a current value detected by the current detecting circuit 15.

Further, the current detecting circuit 15, the control portion 16, and the storage portion 17 function as a switching device.

In the switching device configured in the above-described manner, the voltage value output by the A/D converting portion 32 of the current detecting circuit 15 increases/decreases with an increase/decrease of the value of the current flowing through the first current path, and increases/decreases with an increase/decrease in the value of the current flowing through the second current path. Furthermore, the voltage value output by the current sensor 31 when a current having a current value It flows through the first current path is different from the voltage value output by the current sensor 31 when a current having the same current value It flows through the second current path.

In Embodiment 1, for example, the value of a current flowing through the conductive wire 30 when a current of 100 A flows through the first current path can be matched with the value of a current flowing through the conductive wire 30 when a current of 200 A flows through the second current path. This makes it possible to set the reference voltage value of the A/D converting portion 32 such that the voltage value output by the A/D converting portion 32 accurately indicates the value of a current flowing through each of the first current path and the second current path. When the reference voltage value is set in this manner, it is possible to appropriately switch the current path through which a current flows in the conductor 18. Further, a circuit that detects a current does not need to be formed separately for each of the first current path and the second current path, so that the switching device of Embodiment 1 can be produced at a low cost.

As described previously, the control portion 16 determines whether the current path should be switched, based on the current path through which a current is now flowing and the voltage value output by the A/D converting portion 32, or in other words, the current value detected by the current detecting circuit 15. Accordingly, the current path can be switched with a simple configuration.

Embodiment 2

In Embodiment 1, the control portion 16 converts the voltage value output by the A/D converting portion 32 into a value of the current flowing through the conductor 18. However, the first voltage threshold and the second voltage threshold may also be provided for each of the voltage value output by the A/D converting portion 32 when a current flows through the first current path and the voltage value output to the A/D converting portion 32 when a current flows through the second current path, and the first voltage threshold and the second voltage threshold may also be used to switch the current path.

In the following, points in which Embodiment 2 differs from Embodiment 1 will be described. The components other than components described below are the same as those of Embodiment 1, and thus are denoted by the same reference numerals, with a detailed description thereof being omitted.

A power supply device 1 of Embodiment 2 differs from the power supply device 1 of Embodiment 1 with regard to the switching process executed by the control portion 16. The rest of the configuration of Embodiment 2 is the same as that of Embodiment 1.

Figure 5:
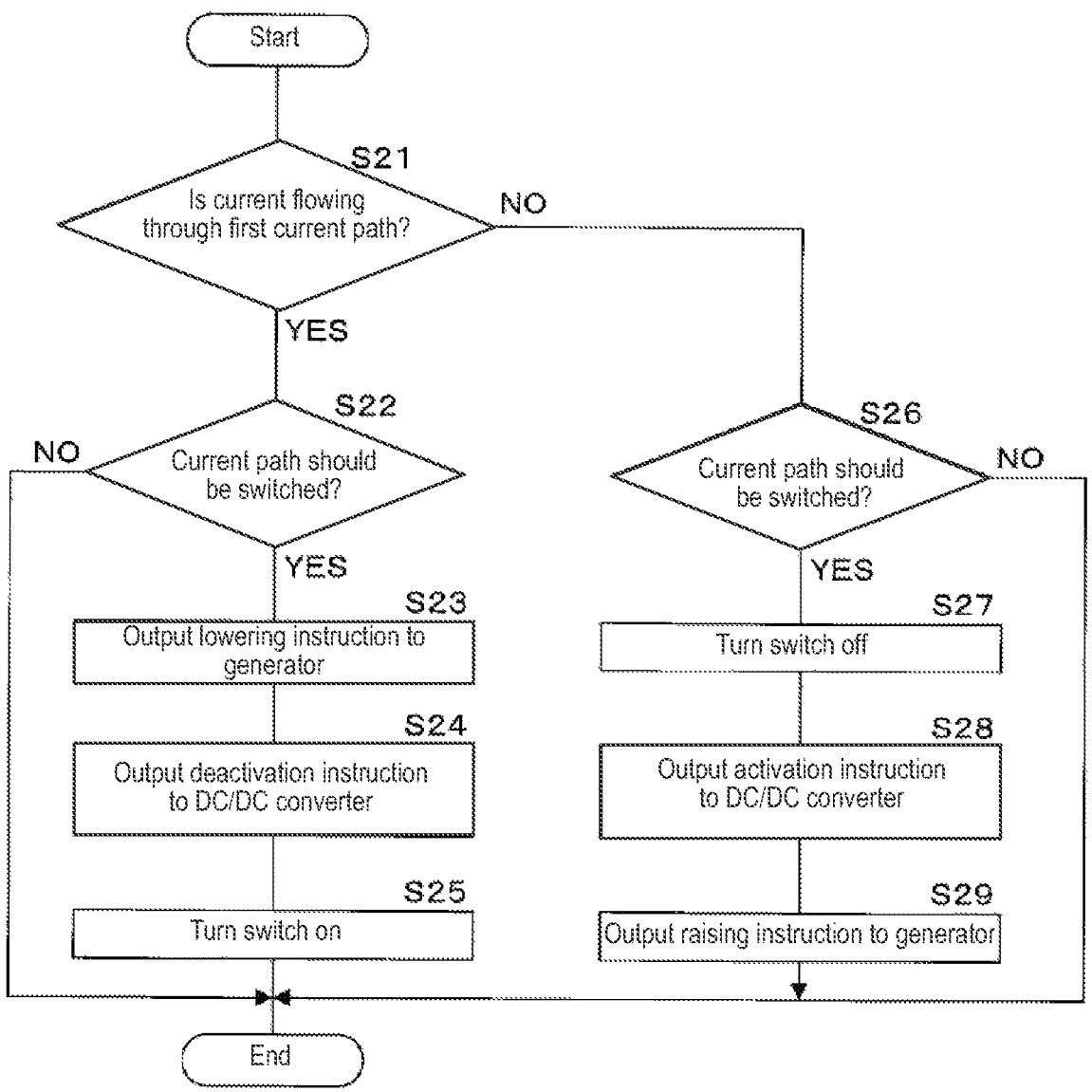
FIG. 5 is a flowchart illustrating a switching process executed by a control portion according to Embodiment 2.

FIG. 5 is a flowchart illustrating a switching process executed by a control portion 16 according to Embodiment 2. In Embodiment 2 as well, the control portion 16 periodically executes the switching process when the generator 10 is generating power.

Of the steps S21 to S29 executed by the control portion 16 of Embodiment 2, steps S21, S23, S24, S25, S27, S28, and S29 are the same as steps S1, S4, S5, S6, S9, S10, and S11 executed by the control portion 16 of Embodiment 1, and therefore a detailed description thereof has been omitted.

If it is determined that a current is flowing through the first current path (S21: YES), the control portion 16 determines whether the current path through which a current flows in the conductor 18 should be switched to the second current path (step S22). If the digital voltage value output by the A/D converting portion 32 is greater than or equal to the first voltage threshold, the control portion 16 determines that the current path should be switched to the second current path. If the digital voltage value output by the A/D converting portion 32 is lower than the first voltage threshold, the control portion 16 determines that the current path should not be switched to the second current path. The first voltage threshold is a voltage value output by the A/D converting portion 32 when a current having a value equal to the first current threshold flows through the first current path. The first voltage threshold is stored in advance in the storage portion 17.

If it is determined that the current path should be switched to the second current path (S22: YES), the control portion 16 executes step S23. If it is determined that the current path should not be switched to the second current path (S22: NO), or after execution of step S25, the control portion 16 ends the switching process.

If it is determined that no current is flowing through the first current path, or in other words, a current is flowing through the second current path (S21: NO), the control portion 16 determines whether the current path through which a current flows in the conductor 18 should be switched to the first current path (step S26). If the digital voltage value output by the A/D converting portion 32 is lower than the second voltage threshold, the control portion 16 determines that the current path should be switched to the first current path. If the digital voltage value output by the A/D converting portion 32 is greater than or equal to the second voltage threshold, the control portion 16 determines that the current path should not be switched to the second current path. The second voltage threshold is a voltage value output by the A/D converting portion 32 when a current having a value equal to the second current threshold flows through the second current path. The second voltage threshold is stored in advance in the storage portion 17. Since the second current threshold is lower than or equal to the first current threshold, the second voltage threshold is lower than or equal to the first voltage threshold.

If it is determined that the current path should be switched to the first current path (S26: YES), the control portion 16 executes step S27. If it is determined that the current path should not be switched to the first current path (S26: NO), or after execution of step S29, the control portion 16 ends the switching process.

In the switching process of Embodiment 2 as well, the control portion 16 determines whether the current path through which a current flows should be switched, based on the current path through which a current is now flowing in the conductor 18, and the voltage value output by the A/D converting portion 32 of the current detecting circuit 15. As described previously, the rest of the configuration of Embodiment 2, other than the switching process executed by the control portion 16, is the same as that of Embodiment 1. Accordingly, in Embodiment 2, the switching device including the current detecting circuit 15, the control portion 16, and the storage portion 17 achieves the same effects as those achieved in Embodiment 1.

Embodiment 3

In Embodiment 1, whether the current path through which a current flows in the conductor 18 should be switched is determined based on the value of the current flowing through the conductive wire 30 connected between the points P1 and P2. However, whether the current path through which a current flows in the conductor 18 should be switched may also be determined based on the voltage value between the points P1 and P2.

In the following, points in which Embodiment 3 differs from Embodiment 1 will be described. The components other than components described below are the same as those of Embodiment 1, and thus are denoted by the same reference numerals, with a detailed description thereof being omitted.

Figure 6:
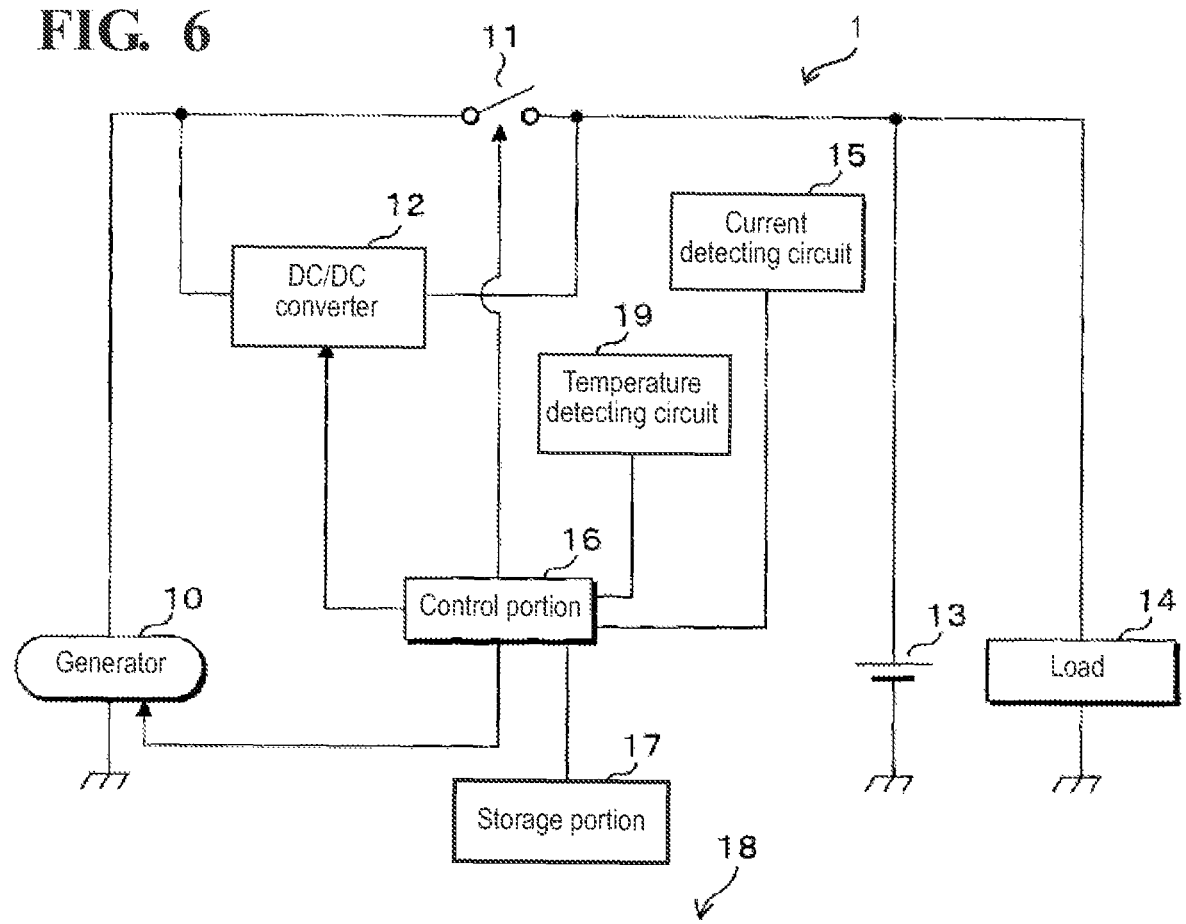
FIG. 6 is a block diagram showing the configuration of a relevant portion of a power supply device according to Embodiment 3.

FIG. 6 is a block diagram showing the configuration of a relevant portion of a power supply device 1 according to Embodiment 3. The power supply device 1 of Embodiment 3 includes a generator 10, a switch 11, a DC/DC converter 12, a battery 13, a load 14, a current detecting circuit 15, a control portion 16, and a storage portion 17, which are connected in the same manner as in Embodiment 1. The power supply device 1 of Embodiment 3 further includes a temperature detecting circuit 19, and the temperature detecting circuit 19 is connected to the control portion 16.

The power supply device 1 of Embodiment 3 differs from the power supply device 1 of Embodiment 1 with regard to the provision of the temperature detecting circuit 19 and the configuration of the current detecting circuit 15.

Figure 7:
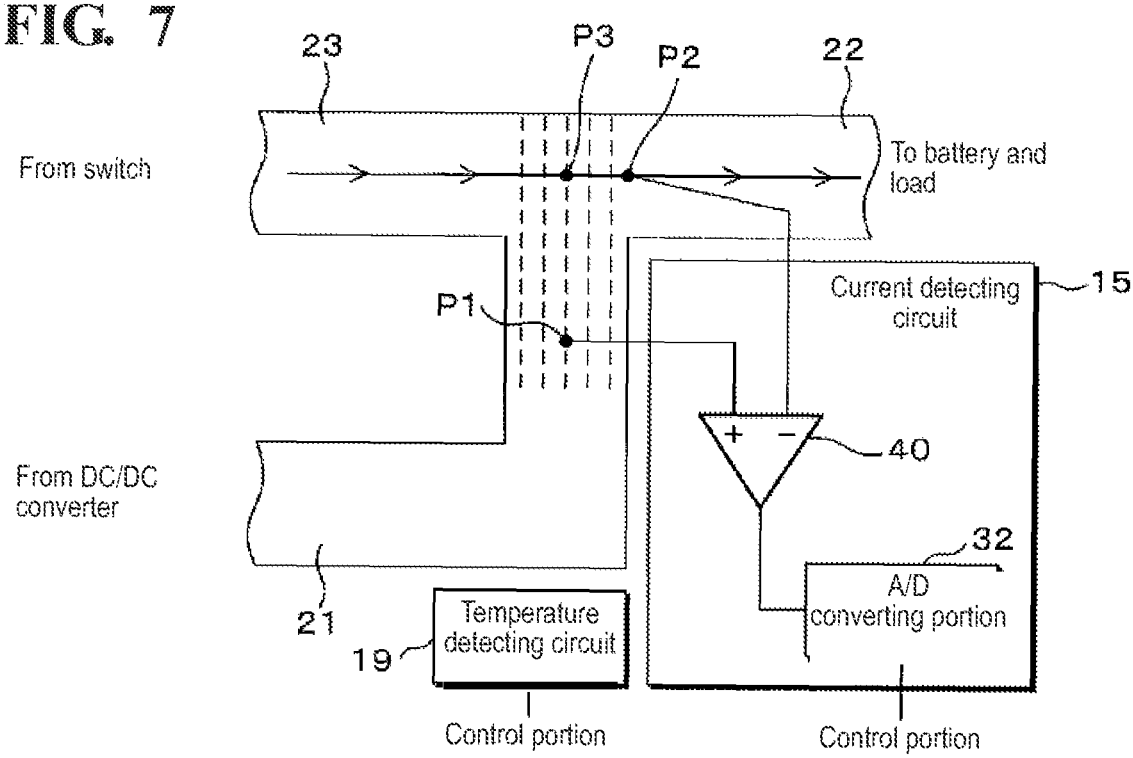
FIG. 7 is a diagram illustrating current detection.

FIG. 7 is a diagram illustrating current detection. As in Embodiment 1, a first conductive portion 21 and a third conductive portion 23 are respectively connected to a second conductive portion 22, and the first conductive portion 21, the second conductive portion 22, and the third conductive portion 23 form a conductor 18. The temperature detecting circuit 19 detects a temperature value of the conductor 18. Specifically, the temperature detecting circuit 19 is composed of a temperature sensor, an A/D converting portion, and the like, which are not shown, and outputs the detected digital temperature value to the control portion 16. The temperature detecting circuit 19 functions as a temperature detecting portion.

The current detecting circuit 15 of Embodiment 3 includes the same A/D converting portion 32 as that of Embodiment 1, and a differential amplifier 40. As for the differential amplifier 40, the positive terminal is connected to a point P1 located on the surface of the first conductive portion 21, and the negative terminal is connected to a point P2 located on the surface of the second conductive portion 22. The output terminal of the differential amplifier 40 is connected to the A/D converting portion 32. The A/D converting portion 32 is further connected to the control portion 16.

The differential amplifier 40 amplifies the voltage value between the points P1 and P2, and outputs the amplified analog voltage value to the A/D converting portion 32.

The A/D converting portion 32 converts the analog voltage value input from the differential amplifier 40 into a digital voltage value, and outputs the converted digital voltage value to the control portion 16. When converting an analog voltage value into a digital voltage value, the A/D converting portion 32 performs processing such as rounding or truncation to quantize the voltage value input from the differential amplifier 40 to a voltage value that is closest or second closest to the voltage value input to the differential amplifier 40, from among the voltage values obtained by equally dividing a preset reference voltage value by a predetermined number. The A/D converting portion 32 outputs the converted digital voltage value to the control portion 16.

In the conductor 18, a voltage drop occurs when a current flows through a first current path or a second current path. At this time, the potential differs depending on the position of the conductor 18. In FIG. 7, equipotential lines formed when a current flows through the second current path as indicated by the solid arrows are indicated by the dashed lines. In FIG. 7, the equipotential lines in one portion of the conductor 18 are shown. Since the current is flowing from the third conductive portion 23 to the second conductive portion 22, the potentials indicated by the equipotential lines on the third conductive portion 23 side are higher than the potentials indicated by the equipotential lines on the second conductive portion 22 side. As can be seen from the equipotential lines in FIG. 7, the potential of the point P1 is the same as the potential of the point P3. Accordingly, the voltage value between the points P1 and P2 is the same as the voltage value between the points P3 and P2.

When a current is flowing through the second current path, the voltage value between the points P3 and P2 increases with an increase in the value of the current flowing through the second current path, and decreases with a decrease in the value of the current flowing through the second current path. Accordingly, in a similar case, the voltage value between the points P1 and P2 also increases with an increase in the value of the current flowing through the second current path, and decreases with a decrease in the value of the current flowing through the second current path.

When a current is flowing through the first current path, the voltage value between the points P1 and P2 increases with an increase in the value of the current flowing through the first current path, and decreases with a decrease in the value of the current flowing through the first current path.

The voltage value between the points P1 and P2 when a current having a current value It flows through the first current path is higher than the voltage value between the points P1 and P2 when a current having the same current value It flows through the second current path.

The digital voltage value output by the A/D converting portion 32 to the control portion 16 corresponds to a value related to the potentials of the points P1 and P2. The differential amplifier 40 amplifying the voltage value between the points P1 and P2 and outputting the amplified analog voltage value to the A/D converting portion 32, and the A/D converting portion 32 converting the analog voltage value input from the differential amplifier 40 into a digital voltage value and outputting the converted voltage value correspond to "detecting the voltage between the points P1 and P2".

The control portion 16 executes the same switching process as that of Embodiment 1. However, the configuration of a specific conversion performed at each of steps S2 and S7 is different from that of Embodiment 1. In Embodiment 3, in each of the first conversion formula and the second conversion formula stored in the storage portion 17, the voltage value output by the A/D converting portion 32 of the current detecting circuit 15 to the control portion 16 and the temperature value output by the temperature detecting circuit 19 to the control portion 16 are variables.

If it is determined that a current is flowing through the first current path (S1: YES), the control portion 16 of Embodiment 3 substitutes the temperature value output by the temperature detecting circuit 19 into the first conversion formula, and thereafter executes step S2. The control portion 16 converts the voltage value output by the A/D converting portion 32 into a current value by using the first conversion formula into which the temperature value output by the temperature detecting circuit 19 has been substituted at step S2. Here, the current value is a value of the current flowing through the first current path. Likewise, if it is determined that no current is flowing through the first current path, or in other words, a current is flowing through the second current path (S1: NO), the control portion 16 of Embodiment 3 substitutes the temperature value output by the temperature detecting circuit 19 into the second conversion formula, and thereafter executes step S7. At step S7, the control portion 16 converts the voltage value output by the A/D converting portion 32 into a current value by using the second conversion formula into which the temperature value output by the temperature detecting circuit 19 has been substituted. Here, the current value is a value of the current flowing through the second current path.

For example, let us assume that the electrical resistivity of the conductor 18 increases with an increase in the temperature value of the conductor 18. When the voltage value between the points P1 and P2 is a fixed value, the current value converted at step S2 or S7 decreases with an increase in the temperature value of the conductor 18, and increases with a decrease in the temperature value of the conductor 18.

In Embodiment 1, the current sensor 31 outputs the voltage value corresponding to the value of the current flowing through the conductive wire 30, and the A/D converting portion 32 converts the analog voltage value output by the current sensor 31 into a digital voltage value. On the other hand, in Embodiment 3, the differential amplifier 40 amplifies the voltage value between the points P1 and P2 and outputs the amplified voltage value, and the A/D converting portion 32 converts the analog voltage value output by the differential amplifier 40 into a digital voltage value. Accordingly, the first conversion formula and the second conversion formula of Embodiment 3 are different from the first conversion formula and the second conversion formula, respectively, of Embodiment 1.

In the switching process, the control portion 16 determines whether the current path through which a current flows should be switched, based on the current path through which a current is now flowing in the conductor 18, the voltage value output by the A/D converting portion 32 of the current detecting circuit 15, and the temperature value detected by the temperature detecting circuit 19. The voltage value output by the A/D converting portion 32 is a value related to the potentials of the points P1 and P2, and corresponds to the voltage value detected by the current detecting circuit 15.

In Embodiment 3, the current detecting circuit 15, the control portion 16, the storage portion 17, and the temperature detecting circuit 19 function as a switching device. The voltage value output by the A/D converting portion 32 of the current detecting circuit 15 increases/decreases with an increase/decrease in the value of the current flowing through the first current path, and increases/decreases with an increase/decrease in the value of the current flowing through the second current path. Furthermore, the voltage value output by the differential amplifier 40 when a current having a current value It flows through the first current path is different from the voltage value output by the differential amplifier 40 when a current having the same current value It flows through the second current path.

In Embodiment 3, for example, the voltage value between the points P1 and P2 when a current of 100 A flows through the first current path can be matched with the voltage value between the points P1 and P2 when a current of 200 A flows through the second current path. This makes it possible to set the reference voltage value of the A/D converting portion 32 such that the voltage value output by the A/D converting portion 32 accurately indicates the value of a current flowing through each of the first current path and the second current path. When the reference voltage value is set in this manner, it is possible to appropriately switch the current path through which a current flows in the conductor 18. Further, a circuit that detects a current does not need to be formed separately for each of the first current path and the second current path, so that the switching device of Embodiment 1 can be produced at a low cost.

As described previously, the control portion 16 determines whether the current path should be switched, based on the current path through which a current is now flowing, and the voltage value output by the A/D converting portion 32, or in other words, the voltage value detected by the current detecting circuit 15. Accordingly, the current path can be switched with a simple configuration.

Furthermore, the control portion 16 determines whether the current path should be switched, based on not only the current path through which a current is now flowing and the voltage value detected by the current detecting circuit 15, but also the temperature value output by the temperature detecting circuit 19, or in other words, the temperature value detected by the temperature detecting circuit 19. Accordingly, the current path through which a current flows in the conductor 18 can be switched more appropriately.

Note that when the temperature value of the conductor 18 is different from the temperature value of the conductive wire 30 in Embodiment 1, the ratios of electrical resistivity of the conductor 18 and the conductive wire 30 are dependent on the temperature values of the conductor 18 and the conductive wire 30, respectively. In Embodiment 1, for example, when the relationship between the temperature value and the electrical resistivity is different between the conductor 18 and the conductive wire 30 because of different materials used for the conductor 18 and the conductive wire 30, the ratios of electrical resistivity of the conductor 18 and the conductive wire 30 are also dependent on the temperature values of the conductor 18 and the conductive wire 30, respectively. To solve this problem of temperature dependence, the switching device of Embodiment 1 may include the temperature detecting circuit 19, and use the first conversion formula and the second conversion formula in which the voltage value output by the A/D converting portion 32 of the current detecting circuit 15 to the control portion 16 and the temperature value output by the temperature detecting circuit 19 to the control portion 16 are variables, as in Embodiment 3.

In this case, as in Embodiment 3, if it is determined that a current is flowing through the first current path (S1: YES), the control portion 16 substitutes the temperature value output by the temperature detecting circuit 19 into the first conversion formula, and thereafter executes step S2. If it is determined that no current is flowing through the first current path, or in other words, a current is flowing through the second current path (S1: NO), the control portion 16 substitutes the temperature value output by the temperature detecting circuit 19 into the second conversion formula, and thereafter executes step S7.

To solve the above-described problem of temperature dependence, the switching device of Embodiment 1 may include a temperature detecting circuit that detects the temperature value of each of the conductor 18 and the conductive wire 30, and use the first conversion formula and the second conversion formula in which the value of the current flowing through the conductive wire 30 and the temperature value of each of the conductor 18 and the conductive wire 30 are variables.

Embodiment 4

In Embodiment 3, the control portion 16 executes the switching process of Embodiment 1. However, the switching process executed by the control portion 16 is not limited to the switching process of Embodiment 1, and the same switching process as that of Embodiment 2 may be executed.

In the following, points in which Embodiment 4 differs from Embodiment 3 will be described. The components other than components described below are the same as those of Embodiment 3, and thus are denoted by the same reference numerals, with a detailed description thereof being omitted.

A power supply device 1 of Embodiment 4 differs from the power supply device 1 of Embodiment 3 with regard to the switching process executed by the control portion 16. The control portion 16 of Embodiment 4 executes the same switching process as that of Embodiment 2. However, Embodiment 4 differs from Embodiment 2 with regard to the configuration of determination performed in each of steps S22 and S26. Specifically, the first voltage threshold used at step S22 differs depending on the temperature value output by the temperature detecting circuit 19 to the control portion 16. Furthermore, the second voltage threshold used at step S27 also differs depending on the temperature value output by the temperature detecting circuit 19 to the control portion 16.

Figures 8, 9:
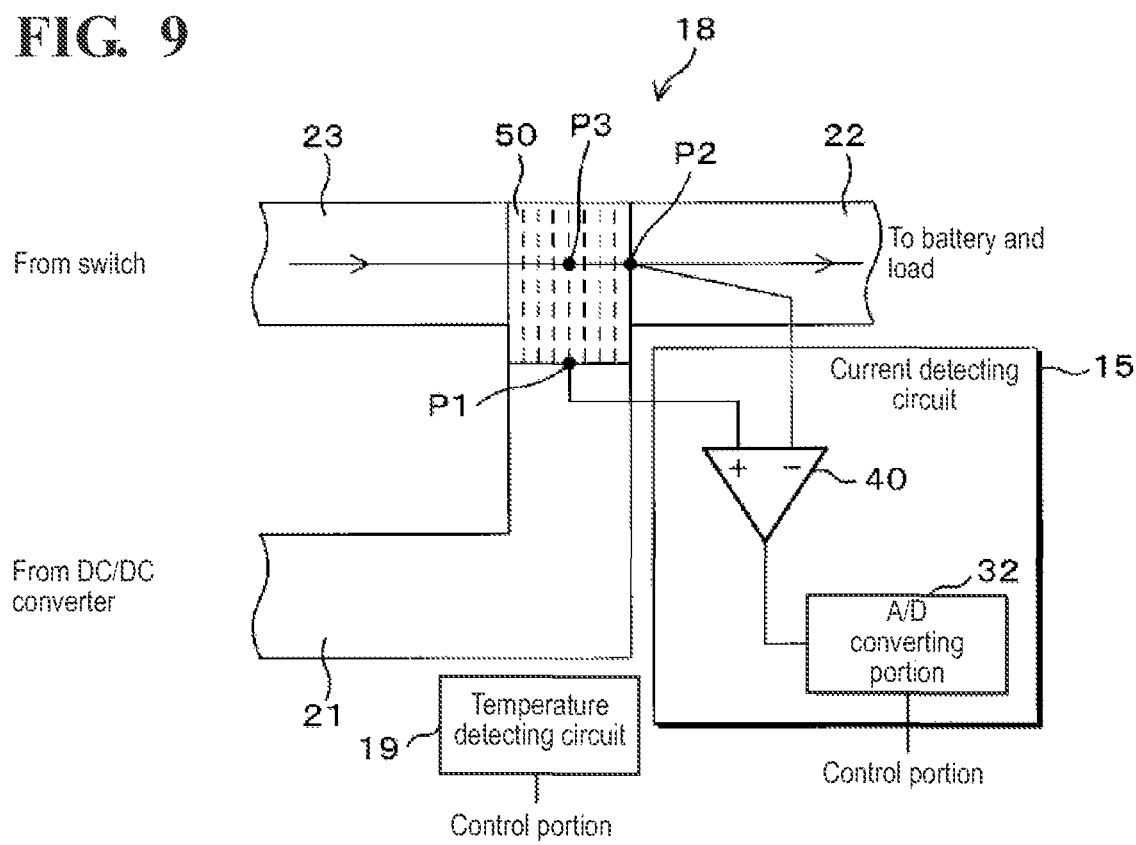
FIG. 8 is a table showing a first voltage threshold and a second voltage threshold according to Embodiment 4.
FIG. 9 is a diagram illustrating current detection according to Embodiment 5.

FIG. 8 is a table showing the first voltage threshold and the second voltage threshold of Embodiment 4. In FIG. 8, each of the first voltage threshold and the second voltage threshold is associated with the temperature value output by the temperature detecting circuit 19 to the control portion 16. The relationship between the temperature value and the first voltage threshold and the relationship between the temperature value and the second voltage threshold are stored in the storage portion 17. In FIG. 8, T1, T2, T3, and T4 are temperature values, V11, V12, V13 . . . and V21, V22, V23, . . . are voltage values. For the magnitude relationship between the temperature values, T1<T2<T3<T4 holds.

If the temperature value output by the temperature detecting circuit 19 to the control portion 16 is greater than or equal to T1 and less than T2, the first voltage threshold and the second voltage threshold are V11 and V21, respectively. If the temperature value output by the temperature detecting circuit 19 to the control portion 16 is greater than or equal to T2 and less than T3, the first voltage threshold and the second voltage threshold are V12 and V22, respectively. If the temperature value output by the temperature detecting circuit 19 to the control portion 16 is greater than or equal to T3 and less than T4, the first voltage threshold and the second voltage threshold are V13 and V23, respectively.

If the electrical resistivity of the conductor 18 increases with an increase in the temperature value of the conductor 18, the voltage value between the points P1 and P2 increases with an increase in the electrical resistivity of the conductor 18 even when a current having the same value is flowing through the first current path (or the second current path). Therefore, if the electrical resistivity of the conductor 18 increases with an increase in the temperature value of the conductor 18, V11<V12<V13 holds for the magnitude relationship between the first voltage thresholds, and V21<V22<V23 holds for the magnitude relationship of the second voltage threshold.

In the switching process, if it is determined that a current is flowing through the first current path (S21: YES), the control portion 16 of Embodiment 4 reads out, from the storage portion 17, a first voltage threshold corresponding to the temperature value output by the temperature detecting circuit 19 to the control portion 16, and thereafter executes step S22. At step S22, if the digital voltage value output by the A/D converting portion 32 is greater than or equal to the read-out first voltage threshold, the control portion 16 determines that the current path should be switched to the second current path. If the digital voltage value output by the A/D converting portion 32 is lower than the read-out first voltage threshold, the control portion 16 determines that the current path should not be switched to the second current path. As in Embodiment 2, the first voltage threshold is a voltage value output by the A/D converting portion 32 when a current having a value equal to the first current threshold flows through the first current path.

In the switching process, if it is determined that no current is flowing through the first current path, or in other words, a current is flowing through the second current path (S21: NO), the control portion 16 of Embodiment 4 reads out, from the storage portion 17, a second voltage threshold corresponding to the temperature value output by the temperature detecting circuit 19 to the control portion 16, and thereafter executes step S26. At step S26, if the digital voltage value output by the A/D converting portion 32 is lower than the read-out second voltage threshold, the control portion 16 determines that the current path should be switched to the first current path. If the digital voltage value output by the A/D converting portion 32 is greater than or equal to the read-out second voltage threshold, the control portion 16 determines that the current path should not be switched to the first current path. As in Embodiment 2, the second voltage threshold is a voltage value output by the A/D converting portion 32 when a current having a value equal to the second current threshold flows through the second current path.

In the switching process of Embodiment 4 as well, the control portion 16 determines whether the current path through which a current flows should be switched, based on the current path through which a current is now flowing in the conductor 18, the voltage value output by the A/D converting portion 32 of the current detecting circuit 15, and the temperature value detected by the temperature detecting circuit 19. Further, the configuration of Embodiment 4 is the same as that of Embodiment 3 except for the switching process executed by the control portion 16 and the correspondence relationship shown in FIG. 8 stored in the storage portion 17. Accordingly, in Embodiment 4, the switching device including the current detecting circuit 15, the control portion 16, the storage portion 17, and the temperature detecting circuit 19 achieves the same effects as those achieved in Embodiment 3.

Note that when the temperature value of the conductor 18 is different from the temperature value of the conductive wire 30, or when the relationship between the temperature value and the electrical resistivity differs between the conductor 18 and the conductive wire 30 in Embodiment 2, the ratios of electrical resistivity of the conductor 18 and the conductive wire 30 are dependent on the temperature values of the conductor 18 and the conductive wire 30, respectively. To solve this problem of temperature dependence, the switching device of Embodiment 2 may include the temperature detecting circuit 19, and the relationship between the temperature value and the first voltage threshold and the relationship between the temperature value and the second voltage threshold may be stored in the storage portion 17, as in Embodiment 4.

In this case, as in Embodiment 4, if it is determined that a current is flowing through the first current path (S21: YES), the control portion 16 reads out, from the storage portion 17, a first voltage threshold corresponding to the temperature value output by the temperature detecting circuit 19 to the control portion 16, and thereafter executes step S22. If it is determined that no current is flowing through the first current path, or in other words, a current is flowing through the second current path (S21: NO), the control portion 16 reads out, from the storage portion 17, a second voltage threshold corresponding to the temperature value output by the temperature detecting circuit 19 to the control portion 16, and thereafter executes step S26.

Furthermore, to solve the above-described problem of temperature dependence, the switching device of Embodiment 1 may include a temperature detecting circuit that detects the temperature value of each of the conductor 18 and the conductive wire 30, and the relationship between the first voltage threshold and the temperature value of each of the conductor 18 and the conductive wire 30, and the relationship between the second temperature value and the temperature value of each of the conductor 18 and the conductive wire 30 may be stored in the storage portion 17.

Note that the configuration for determining the first voltage threshold or the second voltage threshold in Embodiment 4 is not limited to a configuration in which the storage portion 17 reads out the first voltage threshold or second voltage threshold associated with the temperature value. For example, a relation formula between the first voltage threshold (or the second voltage threshold) and the temperature value detected by the temperature detecting circuit 19 may be stored in the storage portion 17. In this case, in the switching process, the control portion 16 calculates the first voltage threshold (or the second voltage threshold) by substituting the temperature value detected by the temperature detecting circuit 19 into the aforementioned relation formula, and uses the calculated first voltage threshold (or second voltage threshold) at step S22 (or step 26).

Also in the aforementioned configuration in which the feature of Embodiment 4 is incorporated into the switching device of Embodiment 2, the configuration for determining the first voltage threshold or the second voltage threshold is not limited to a configuration in which the storage portion 17 reads out the first voltage threshold or second voltage threshold associated with the temperature value.

Embodiment 5

When the resistance value between the points P1 and P2 is small in Embodiment 3, the variation range of the voltage value between the points P1 and P2 relative to the variation range of the current flowing through the conductor 18 is small. The conductor 18 may further include a resistive portion having a lower conductivity than any of the first conductive portion 21, the second conductive portion 22, and the third conductive portion 23 such that the resistance value between the points P1 and P2 becomes large.

In the following, points in which Embodiment 5 differs from Embodiment 3 will be described. The components other than components described below are the same as those of Embodiment 3, and thus are denoted by the same reference numerals, with a detailed description thereof being omitted.

The power supply device 1 of Embodiment 5 differs from the power supply device 1 of Embodiment 3 with regard to the configuration of the conductor 18 and the target of detection of the temperature value by the temperature detecting circuit 19.

FIG. 9 is a diagram illustrating current detection according to Embodiment 5. The conductor 18 of Embodiment 5 includes a resistive portion 50, in addition to the first conductive portion 21, the second conductive portion 22, and the third conductive portion 23. The resistive portion 50 has a rectangular plate shape. An end portion of the third conductive portion 23 is coupled to a side of the resistive portion 50, and an end portion of the second conductive portion 22 is coupled to a side of the resistive portion 50 that opposes the aforementioned side. A side of the first conductive portion 21 is coupled to one of two sides of the resistive portion 50 other than the two sides to which the second conductive portion 22 and the third conductive portion 23 are coupled. In this manner, each of the first conductive portion 21 and the third conductive portion 23 is connected to the second conductive portion 22 via the resistive portion 50. FIG. 9 shows a plate surface of each of the first conductive portion 21, the second conductive portion 22, the third conductive portion 23, and the resistive portion 50 is shown.

The point P1 is located in the coupling portion of the first conductive portion 21 and the resistive portion 50. The point P2 is located in the coupling portion of the second conductive portion 22 and the resistive portion 50.

The temperature detecting circuit 19 of Embodiment 5 detects the temperature value of the resistive portion 50. Specifically, the temperature detecting circuit 19 is composed of, for example, a temperature sensor and an A/D converting portion (not shown), and outputs the detected digital temperature value to the control portion 16.

When a current flows through the first current path in the conductor 18 of Embodiment 5, the current flows through the first conductive portion 21, the resistive portion 50, and the second conductive portion 22 in this order. When a current flows through the second current path in the conductor 18 of Embodiment 5, the current flows through the third conductive portion 23, the resistive portion 50, and the second conductive portion 22 in this order.

A voltage drop occurs when a current flows through the first current path or the second current path. At this time, the potential differs depending on the position of the conductor 18. In FIG. 9, equipotential lines formed when a current flows through the second current path as indicated by the solid arrows are indicated by dashed lines. In FIG. 9, the equipotential lines in the resistive portion 50 are shown. Since the current flows from the third conductive portion 23 to the second conductive portion 22, the potentials indicated by the equipotential lines on the third conductive portion 23 side are higher than the potentials indicated by the equipotential lines on the second conductive portion 22. As can be seen from the equipotential lines in FIG. 9, the potential of the point P1 is the same as the potential of the point P3. Accordingly, the voltage value between the points P1 and P2 is the same as the voltage value between the points P3 and P2.

The equipotential lines shown in each of the FIG. 7 and FIG. 9 are equipotential lines formed when a current having the same value flows through the second current path in Embodiments 3 and 5. The voltage difference between adjacent equipotential lines in FIG. 9 is the same as the voltage difference between adjacent equipotential lines in FIG. 7. The conductivity of the resistive portion 50 is lower than the conductivity of any of the first conductive portion 21, the second conductive portion 22, and the third conductive portion 23. Accordingly, the voltage is significantly lowered between the points P1 and P2 by the resistive portion 50 when a current flows through the second current path as indicated by the solid arrows in FIG. 9. This can be also understood from the fact that the number of equipotential lines between the points P3 and P2 in FIG. 9 is larger than the number of equipotential lines between the points P3 and P2 in FIG. 7.

As in Embodiment 3, when a current is flowing through the second current path, the voltage value between the points P1 and P2 increases with an increase in the value of the current flowing through the second current path, and decreases with a decrease in the value of the current flowing through the second current path. When a current is flowing through the first current path, the voltage value between the points P1 and P2 increases with an increase in the value of the current flowing through the first current path, and decreases with a decrease in the value of the current flowing through the first current path.

As in Embodiment 3, the voltage value between the points P1 and P2 when a current having a current value It flows through the first current path is larger than the voltage value between the points P1 and P2 when a current having the same current value It flows through the second current path.

The control portion 16 of Embodiment 5 executes the same switching process as that executed in Embodiment 3. However, as described previously, the temperature detecting circuit 19 detects the temperature value of the resistive portion 50, and therefore, the temperature value substituted into the first conversion formula and the second conversion formula before each of steps S2 and S7 is executed is the temperature value of the resistive portion 50.

The conductor 18 includes the resistive portion 50. Furthermore, the temperature value substituted into the first conversion formula and the second conversion formula is the temperature value of the resistive portion 50. Accordingly, the first conversion formula and the second conversion formula stored in the storage portion 17 of Embodiment 5 are different from the first conversion formula and the second conversion formula, respectively, stored in the storage portion 17 of Embodiment 3.

For example, let us assume that the electrical resistivity of the resistive portion 50 increases with an increase in the temperature value of the resistive portion 50. When the voltage value between the points P1 and P2 is a fixed value, the current value converted at step S2 or S7 decreases with an increase in the temperature value of the resistive portion 50, and increases with a decrease in the temperature value of the resistive portion 50.

In the switching process of Embodiment 5 as well, the control portion 16 determines whether the current path through which a current flows should be switched, based on the current path through which a current is now flowing in the conductor 18, the voltage value output by the A/D converting portion 32 of the current detecting circuit 15, and the temperature value detected by the temperature detecting circuit 19.

In Embodiment 5 as well, the current detecting circuit 15, the control portion 16, the storage portion 17, and the temperature detecting circuit 19 function as a switching device. The voltage value output by the A/D converting portion 32 of the current detecting circuit 15 increases/decreases with an increase/decrease in the value of the current flowing through the first current path, and increases/decreases with an increase/decrease in the value of the current flowing through the second current path. Furthermore, the voltage value output by the differential amplifier 40 when a current having a current value It flows through the first current path is different from the voltage value output by the differential amplifier 40 when a current having the same current value It flows through the second current path.

In Embodiment 5, for example, the voltage value between the points P1 and P2 when a current of 100 A flows through the first current path can be matched with the voltage value between the points P1 and P2 when a current of 200 A flows through the second current path. This makes it possible to set the reference voltage value of the A/D converting portion 32 such that the voltage value output by the A/D converting portion 32 accurately indicates the value of a current flowing through each of the first current path and the second current path. When the reference voltage value is set in this manner, it is possible to appropriately switch the current path through which a current flows in the conductor 18. Further, a circuit that detects a current does not need to be formed separately for each of the first current path and the second current path, so that the switching device of Embodiment 1 can be produced at a low cost.

As described previously, the control portion 16 determines whether the current path should be switched, based on the current path through which a current is now flowing, and the voltage value output by the A/D converting portion 32, or in other words, the voltage value detected by the current detecting circuit 15. Accordingly, the current path can be switched with a simple configuration.

Furthermore, the control portion 16 determines whether the current path should be switched, based on not only the current path through which a current is now flowing and the voltage value detected by the current detecting circuit 15, but also the temperature value output by the temperature detecting circuit 19, or in other words, the temperature value detected by the temperature detecting circuit 19. Accordingly, the current path through which a current flows in the conductor 18 can be switched more appropriately.

In the switching device of Embodiment 5, the conductor 18 includes the resistive portion 50, and therefore, the voltage value between the points P1 and P2 is large, making it possible for the control portion 16 to further appropriately determine whether the current path should be switched in the switching process.

Note that in Embodiment 5, the storage portion 17 may be configured in the same manner as in Embodiment 4, and the control portion 16 may execute the switching process of Embodiment 4. As described previously, the temperature value output by the temperature detecting circuit 19 to the control portion 16 is not the temperature value of the conductor 18, but the temperature value of the resistive portion 50. Accordingly, the first voltage thresholds V11, V12, V13, . . . , and the second voltage thresholds V21, V22, V23, . . . that are stored in the storage portion 17 in association with the temperature values output by the temperature detecting circuit 19 to the control portion 16 are different from those of Embodiment 4.

If the electrical resistivity of the resistive portion 50 increases with an increase in the temperature value of the resistive portion 50, the voltage value between the points P1 and P2 increases with an increase in the electrical resistivity of the resistive portion 50 even when a current having the same value is flowing through the first current path (or the second current path). Therefore, if the electrical resistivity of the resistive portion 50 increases with an increase in the temperature value of the resistive portion 50, $V11<V12<V13$ holds for the magnitude relationship between the first voltage thresholds, and $V21<V22<V23$ holds for the magnitude relationship between the second voltage thresholds.

Even when the control portion 16 of Embodiment 5 executes the switching process of Embodiment 4, the same effects as those achieved in Embodiment 5 described above can be achieved.

In Embodiment 5, the position of the point P1 is not limited to the coupling portion of the first conductive portion 21 and the resistive portion 50, and may be any position on the surface of the first conductive portion 21. Likewise, the position of the point P2 is also not limited to the coupling portion of the second conductive portion 22 and the resistive portion 50, and may be any position on the surface of the second conductive portion 22.

Furthermore, in Embodiment 5, the shape of the resistive portion 50 is not limited to a rectangular plate shape, and may be, for example, a T-shape or an L-shape. The side of the resistive portion 50 to which the first conductive portion 23 is connected does not need to oppose the side thereof to which the second conductive portion 22 is connected. It is sufficient that each of the first conductive portion 21 and the third conductive portion 23 is connected to the second conductive portion 22 via the resistive portion 50.

The conductor 18 of Embodiment 5 may be used in the above-described configurations in which the switching device of Embodiment 1 includes the temperature detecting circuit 19, or the temperature detecting circuit that detects the temperature value of each of the conductor 18 and the conductive wire 30. Likewise, the conductor 18 of Embodiment 5 may be used in the above-described configurations in which the switching device of Embodiment 2 includes the temperature detecting circuit 19, or the temperature detecting circuit that detects the temperature value of each of the conductor 18 and the conductive wire 30.

Embodiment 6

In Embodiment 1, the control portion 16 switches the path of a current flowing in the conductor 18 by turning the switch 11 on/off and activating/deactivating the DC/DC converter 12. However, the control portion 16 may switch the current path through which a current flows through in the conductor 18 by using another DC/DC converter in place of the switch 11, and controlling activation/deactivation of this DC/DC converter and activation/deactivation of the DC/DC converter 12.

In the following, points in which Embodiment 6 differs from Embodiment 1 will be described. The components other than components described below are the same as those of Embodiment 1, and thus are denoted by the same reference numerals, with a detailed description thereof being omitted.

Figure 10:
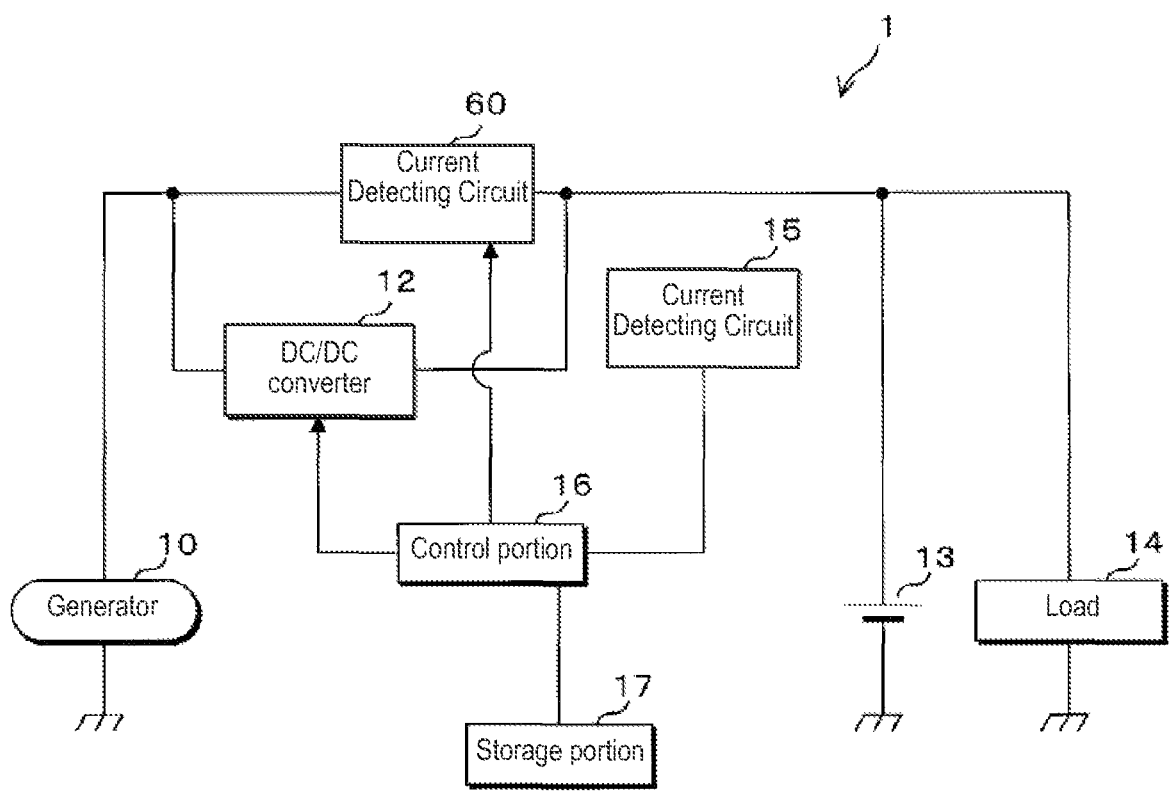
FIG. 10 is a block diagram showing the configuration of a relevant portion of a power supply device according to Embodiment 6.

FIG. 10 is a block diagram showing the configuration of a relevant portion of a power supply device 1 according to Embodiment 6. The power supply device 1 of Embodiment 6 includes a generator 10, a DC/DC converter 12, a battery 13, a load 14, a current detecting circuit 15, a control portion 16, and a storage portion 17, which are connected in the same manner as in Embodiment 1. The power supply device 1 of Embodiment 6 further includes a DC/DC converter 60. One end of the DC/DC converter 60 is connected to one end of the generator 10, and the other end of the DC/DC converter 60 is connected to a positive electrode of the battery 13 and one end of the load 14.

As with the DC/DC converter 12, the DC/DC converter 60 transforms the output voltage of the generator 10 that is applied to one end thereof into a predetermined voltage, and supplies the transformed voltage to the battery 13 and the load 14 from the other end. The value of the voltage transformed by the DC/DC converter 60 is 12 V, for example.

As with the DC/DC converter 12, the activation instruction and the deactivation instruction are also input to the DC/DC converter 60 from the control portion 16. The DC/DC converter 60 is activated when the activation instruction is input to the control portion 16, and is deactivated when the deactivation instruction is input from the control portion 16.

When one of the DC/DC converters 12 and 60 is activated, the other DC/DC converter is being deactivated. The transformed voltage is supplied to the battery 13 and the load 14 from one of the DC/DC converters 12 and 60. Consequently, the battery 13 stores power, and the load 14 is powered. When the generator 10 stops power generation, the load 14 is powered by the battery 13.

As described in Embodiment 1, there is an upper limit to the value of a current flowing via the DC/DC converter 12. A current above this upper limit may flow through the DC/DC converter 60. The first current threshold is lower than the upper limit. As described previously, the second current threshold is lower than or equal to the first current threshold.

In the power supply device 1 of Embodiment 6, the conductor 18 connects the other ends of the DC/DC converters 12 and 60 to the positive electrode of the battery 13 and one end of the load 14. More specifically, the other end of the DC/DC converter 12 is connected to the first conductive portion 21, and the other end of the DC/DC converter 60 is connected to the third conductive portion 23. The positive electrode of the battery 13 and one end of the load 14 are connected to the second conductive portion 22.

The control portion 16 executes the same switching process as that of Embodiment 1. At step S6 of the switching process (see FIG. 4) of Embodiment 1, the control portion 16 outputs the activation instruction to the DC/DC converter 60, instead of turning the switch 11 on. Furthermore, at step S9, the control portion 16 outputs the deactivation instruction to the DC/DC converter 60, instead of turning the switch 11 off.

In the switching process, the control portion 16 outputs the deactivation instruction to the DC/DC converter 12, and outputs the activation instruction to the DC/DC converter 60. Consequently, the DC/DC converter 12 is deactivated, and the DC/DC converter 60 is activated, so that the current path through which a current flows in the conductor 18 is switched from the first current path to the second current path.

In the switching process, the control portion 16 outputs the deactivation instruction to the DC/DC converter 60, and outputs the activation instruction to the DC/DC converter 12. Consequently, the DC/DC converter 60 is deactivated, and the DC/DC converter 12 is activated, so that the current path through which a current flows in the conductor 18 is switched from the second current path to the first current path.

As described thus far, the control portion 16 switches the current path through which a current flows in the conductor 18 by separately outputting the activation instruction or the deactivation instruction to the DC/DC converters 12 and 60.

As with the control portion 16 of Embodiment 1, the control portion 16 of Embodiment 6 determines whether the current path through which a current flows in the conductor 18 should be switched. Therefore, in Embodiment 6, the switching device including the current detecting circuit 15, the control portion 16, and the storage portion 17 achieves the same effects as those achieved in Embodiment 1.

Note that in Embodiments 2 to 5, the power supply device 1 may include the DC/DC converter 60 in place of the switch 11, as in Embodiment 6. At this time, the control portion 16 switches the current path through which a current flows in the conductor 18, as in Embodiment 6. The thus configured switching device of each of Embodiments 2 to 5 also achieves the same effects as those achieved by the switching devices of Embodiments 2 to 5 that include the switch 11.

Note that in Embodiments 1 to 6, each of the first conductive portion 21, the second conductive portion 22, and the third conductive portion 23 is not limited to a bus bar, and may be, for example, a conductor included in a printed-circuit board. In Embodiments 3 to 5, the control portion 16 and the temperature detecting circuit 19 are formed separately. However, the control portion 16 and the temperature detecting circuit 19 may be formed integrally.

Embodiments 1 to 6 disclosed herein are to be construed in all aspect as illustrative and not limiting. The scope of the present invention is defined by the claims, rather than the above description, and is intended to include all modifications which fall within the scope of the claims and the meaning and scope of equivalents thereof.

Figure 1:
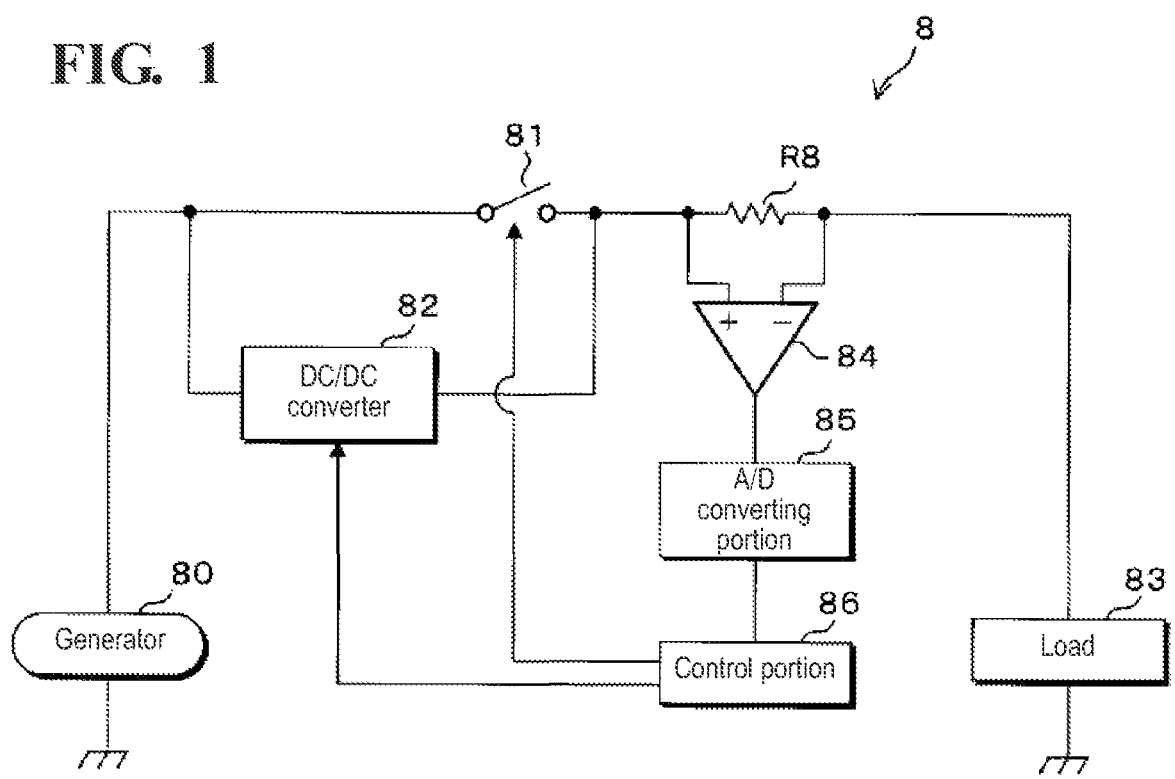
FIG. 1 is a block diagram showing the configuration of a relevant portion of a conventional power supply device.

FIG. 1
80 generator
82 DC/DC converter
83 load
85 A/D converting portion
86 control portion FIG. 2
10 generator
12 DC/DC converter
14 load
15 current detecting circuit
16 control portion
17 storage portion FIG. 3
from switch
to battery and load
from DC/DC converter
15 current detecting circuit
32 A/D converting portion
control portion FIG. 4
start
S1 is current flowing through first current path?
S2 convert voltage value into current value by using first conversion formula
S3 current path should be switched?
S4 output lowering instruction to generator
S5 output deactivation instruction to DC/DC converter
S6 turn switch on
S7 convert voltage value into current value by using second conversion formula
S8 current path should be switched?
S9 turn switch off
S10 output activation instruction to DC/DC converter
S11 output raising instruction to generator
end FIG. 5
start
S21 is current flowing through first current path?
S22 current path should be switched?
S23 output lowering instruction to generator
S24 output deactivation instruction to DC/DC converter
S25 turn switch on
S26 current path should be switched?
S27 turn switch off
S28 output activation instruction to DC/DC converter
S29 output raising instruction to generator
end FIG. 6
10 generator
12 DC/DC converter
14 load
15 current detecting circuit
16 control portion
17 storage portion FIG. 7
from switch
to battery and load
from DC/DC converter
15 current detecting circuit
19 temperature detecting circuit
32 A/D converting portion
control portion FIG. 8
temperature value
first voltage threshold
second voltage threshold FIG. 9
from switch
to battery and load
from DC/DC converter
15 current detecting circuit
19 temperature detecting circuit
32 A/D converting portion
control portion FIG. 10
10 generator
12 DC/DC converter
14 load
15 current detecting circuit
16 control portion
17 storage portion
60 DC/DC converter

The invention claimed is:

1. A current detecting device comprising:
    a conductive plate having a first conductive portion, a second conductive portion and a third conductive portion wherein the first conductive portion is electrically connected to the third conductive portion in parallel and wherein the first conductive portion and the third conductive portion are electrically connected to the second conductive portion in series;
    a potential difference detecting portion that detects a value related to a potential difference between two points located on plate surfaces of the first conductive portion and the second conductive portion, wherein the value is one of the current flowing between the two points and a voltage difference between the two points; and
    a temperature detecting portion that detects a temperature value of a conductor formed by connecting the first conductive portion and the third conductive portion with the second conductive portion; and
    a calculating portion that calculates the value of the current flowing through the first current path or the second current path, based on the temperature value detected by the temperature detecting portion and the voltage value output by the current detecting circuit.

2. The current detecting device according to claim 1, comprising:
    a conductive wire connected between the two points, wherein the potential difference detecting portion detects the value of a current flowing through the conductive wire.

3. The current detecting device according to claim 1, wherein each of the first conductive portion and the third conductive portion is connected to the second conductive portion via a resistive portion having a lower conductivity than the first conductive portion, the second conductive portion, and the third conductive portion.

4. The switching device according to 1, wherein
the switching device performs the switching by controlling activation/deactivation of a transforming portion that transforms an applied voltage and outputs the transformed voltage to the first conductive portion, and turning a switch on/off whose one end is connected to the third conductive portion.

5. The current detecting according to claim 2, wherein each of the first conductive portion and the third conductive portion is connected to the second conductive portion via a resistive portion having a lower conductivity than the first conductive portion, the second conductive portion, and the third conductive portion.

6. A switching device comprising:
the current detecting circuit according to claim 2; and
a switching portion that switches a current path through which a current flows, to the first current path or the second current path, wherein
the switching portion performs the switching based on which of the first current path and the second current path a current is flowing through, and the voltage value output by the current detecting circuit.

7. A switching device comprising:
the current detecting circuit according to claim 2;
a switching portion that switches a current path through which a current flows, to the first current path or the second current path; and
a temperature detecting portion that detects a temperature value of a conductor formed by connecting the first conductive portion and the third conductive portion with the second conductive portion, wherein
the switching portion performs the switching based on which of the first current path and the second current path a current is flowing through, the voltage value output by the current detecting circuit, and the temperature value detected by the temperature detecting portion.

8. A current detecting device comprising:
a conductive plate having a first conductive portion, a second conductive portion and a third conductive portion wherein the first conductive portion is electrically connected to the third conductive portion in parallel and wherein the first conductive portion and the third conductive portion are electrically connected to the second conductive portion in series;
a potential difference detecting portion that detects a value related to a potential difference between two points located on plate surfaces of the first conductive portion and the second conductive portion; wherein the value is one of the current flowing between the two points and a voltage difference between the two points, wherein each of the first conductive portion and the third conductive portion is connected to the second conductive portion via a resistive portion having a lower conductivity than the first conductive portion, the second conductive portion, and the third conductive portion; and
a temperature detecting portion that detects a temperature value of the resistive portion; and
a calculating portion that calculates the value of the current flowing through the first current path or the second current path, based on the temperature value detected by the temperature detecting portion and the voltage value output by the current detecting circuit.

9. A switching device comprising:
a conductive plate having a first conductive portion, a second conductive portion and a third conductive portion wherein the first conductive portion is electrically connected to the third conductive portion in parallel and wherein the first conductive portion and the third conductive portion are electrically connected to the second conductive portion in series;
a potential difference detecting portion that detects a value related to a potential difference between two points located on plate surfaces of the first conductive portion and the second conductive portion; wherein the value is one of the current flowing between the two points and a voltage difference between the two points;
a switching portion that switches a current path through which the current flows, to the first current path or the second current path; and
a temperature detecting portion that detects a temperature value of a conductor formed by connecting the first conductive portion and the third conductive portion with the second conductive portion, wherein
the switching portion performs the switching based on which of the first current path and the second current path the current is flowing through, the voltage value output by the current detecting circuit, and the temperature value detected by the temperature detecting portion.

10. The switching device according to claim 9, wherein the switching device performs the switching by controlling activation/deactivation of a transforming portion that transforms an applied voltage and outputs the transformed voltage to the first conductive portion, and turning a switch on/off whose one end is connected to the third conductive portion.

11. A switching device comprising:
a conductive plate having a first conductive portion, a second conductive portion and a third conductive portion wherein the first conductive portion is electrically connected to the third conductive portion in parallel and wherein the first conductive portion and the third conductive portion are electrically connected to the second conductive portion in series;
a potential difference detecting portion that detects a value related to a potential difference between two points located on plate surfaces of the first conductive portion and the second conductive portion; wherein the value is one of the current flowing between the two points and a voltage difference between the two points, wherein each of the first conductive portion and the third conductive portion is connected to the second conductive portion via a resistive portion having a lower conductivity than the first conductive portion, the second conductive portion, and the third conductive portion;
a switching portion that switches a current path, through which a current flows, to the first current path or the second current path; and
a temperature detecting portion that detects a temperature value of the resistive portion, wherein
the switching portion performs the switching based on which of the first current path and the second current path a current is flowing through, the voltage value output by the current detecting circuit, and the temperature value detected by the temperature detecting portion.

12. The switching device according to claim 11, wherein the switching device performs the switching by controlling activation/deactivation of a transforming portion that transforms an applied voltage and outputs the transformed voltage to the first conductive portion, and turning a switch on/off whose one end is connected to the third conductive portion.

* * * * *